US008229587B2

(12) United States Patent
Shieh et al.

(10) Patent No.: US 8,229,587 B2
(45) Date of Patent: Jul. 24, 2012

(54) SEMICONDUCTOR FABRICATION FACILITY VISUALIZATION SYSTEM WITH PERFORMANCE OPTIMIZATION

(75) Inventors: Karl Shieh, Fremont, CA (US); Michael A. Cookson, Fremont, CA (US); Norma B. Riley, Durham, CA (US); Donald Rex Wright, Cupertino, CA (US); Joseph John Fatula, Jr., San Jose, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 383 days.

(21) Appl. No.: 12/390,395

(22) Filed: Feb. 20, 2009

(65) Prior Publication Data

US 2010/0023151 A1 Jan. 28, 2010

Related U.S. Application Data

(60) Provisional application No. 61/030,847, filed on Feb. 22, 2008, provisional application No. 61/037,298, filed on Mar. 17, 2008.

(51) Int. Cl.
*G06F 19/00* (2011.01)

(52) U.S. Cl. .............. 700/112; 700/95; 700/110

(58) Field of Classification Search ............ 700/95, 700/110, 112
See application file for complete search history.

(56) References Cited

U.S. PATENT DOCUMENTS

| | | | | |
|---|---|---|---|---|
| 5,995,912 A * | 11/1999 | DeWolf et al. | ............ | 702/85 |
| 6,393,602 B1 * | 5/2002 | Atchison et al. | ............ | 716/56 |
| 6,519,498 B1 * | 2/2003 | Jevtic et al. | ............ | 700/101 |
| 6,622,055 B2 * | 9/2003 | Fan et al. | ............ | 700/99 |
| 6,671,570 B2 * | 12/2003 | Schulze | ............ | 700/121 |
| 6,778,879 B2 * | 8/2004 | Chang et al. | ............ | 700/223 |
| 6,856,847 B2 * | 2/2005 | Kao et al. | ............ | 700/100 |
| 6,957,114 B1 * | 10/2005 | Logsdon et al. | ............ | 700/100 |

(Continued)

FOREIGN PATENT DOCUMENTS

CN 1535435 A 10/2004

(Continued)

OTHER PUBLICATIONS

"A Simulation-Based Experiment for Comparing AMHS Performance in a Semiconductor Fabrication Facility", Mackulak et al, IEEE Transactions on Semiconductor Manufacturing, vol. 14, No. 3, Aug. 2001.*

(Continued)

*Primary Examiner* — Michael D Masinick
(74) *Attorney, Agent, or Firm* — Fish & Richardson P.C.

(57) ABSTRACT

A semiconductor fabrication facility (fab) configuration module is defined to virtually model physical systems and attributes of a fab. A data acquisition module is defined to interface with the physical systems of the fab and gather operational data from the physical systems. A visualizer module is defined to collect and aggregate the operational data gathered from the physical systems. The visualizer module is further defined to process the operational data into a format suitable for visual rendering. The processed operational data is displayed within a visual context of the fab in a graphical user interface controlled by the visualizer module. An analyzer module is defined to analyze data collected by the visualizer module and to resolve queries regarding fab performance. An optimizer module is defined to control systems within the fab in response to data collected by the visualizer module, data generated by the analyzer module, or a combination thereof.

24 Claims, 33 Drawing Sheets

U.S. PATENT DOCUMENTS

| | | | |
|---|---|---|---|
| 2003/0061212 | A1 | 3/2003 | Smith et al. |
| 2004/0049398 | A1* | 3/2004 | Gartland et al. ........... 705/1 |
| 2004/0148049 | A1* | 7/2004 | Schwarm ............... 700/121 |
| 2005/0075748 | A1* | 4/2005 | Gartland et al. .......... 700/108 |
| 2006/0009943 | A1 | 1/2006 | Keck et al. |
| 2011/0166684 | A1* | 7/2011 | Moyne et al. ............ 700/103 |

FOREIGN PATENT DOCUMENTS

| | | |
|---|---|---|
| JP | 2002-312021 | 10/2002 |
| KR | 10-2005-0018715 | 2/2005 |

OTHER PUBLICATIONS

"Design of experiment (DOE) method considering interaction effect of process parameters for optimization of copper chemical mechanical polishing (CMP) process", Kim et al, Microelectronic Engineering 83 (2006).*

"A simulation model to characterize the photolithography process of a semiconductor wafer fabrication", Arisha et al, Journal of Materials Processing Technology, 155-156, 2004.*

Notification Concerning Transmittal of International Preliminary Report on Patentability and Written Opinion of the International Searching Authority from corresponding International application No. PCT/US2009/034791, dated Sep. 2, 2010.

International Search Report for PCT/US2009/034791 dated Nov. 16, 2009.

First Office Action from corresponding Chinese Application No. 200980110280.9 dated Jul. 26, 2011.

* cited by examiner

```
1  function Dijkstra(Graph, source):
2      for each vertex v in Graph:            // Initializations
3          dist[v] := infinity                // Unknown distance function from source to v
4          previous[v] := undefined
5      dist[source] := 0                      // Distance from source to source
6      Q := copy(Graph)                       // All nodes in the graph are unoptimized - thus are in Q
7      while Q is not empty:                  // The main loop
8          u := extract_min(Q)                // Remove and return best vertex from nodes in Q;
                                              // returns source on first iteration
9          for each neighbor v of u:          // where v has not yet been considered
10             alt = dist[u] + length(u, v)
11             if alt < dist[v]               // Relax (u, v)
12                 dist[v] := alt
13                 previous[v] := u
14     return previous[ ]
```

FIG. 3C

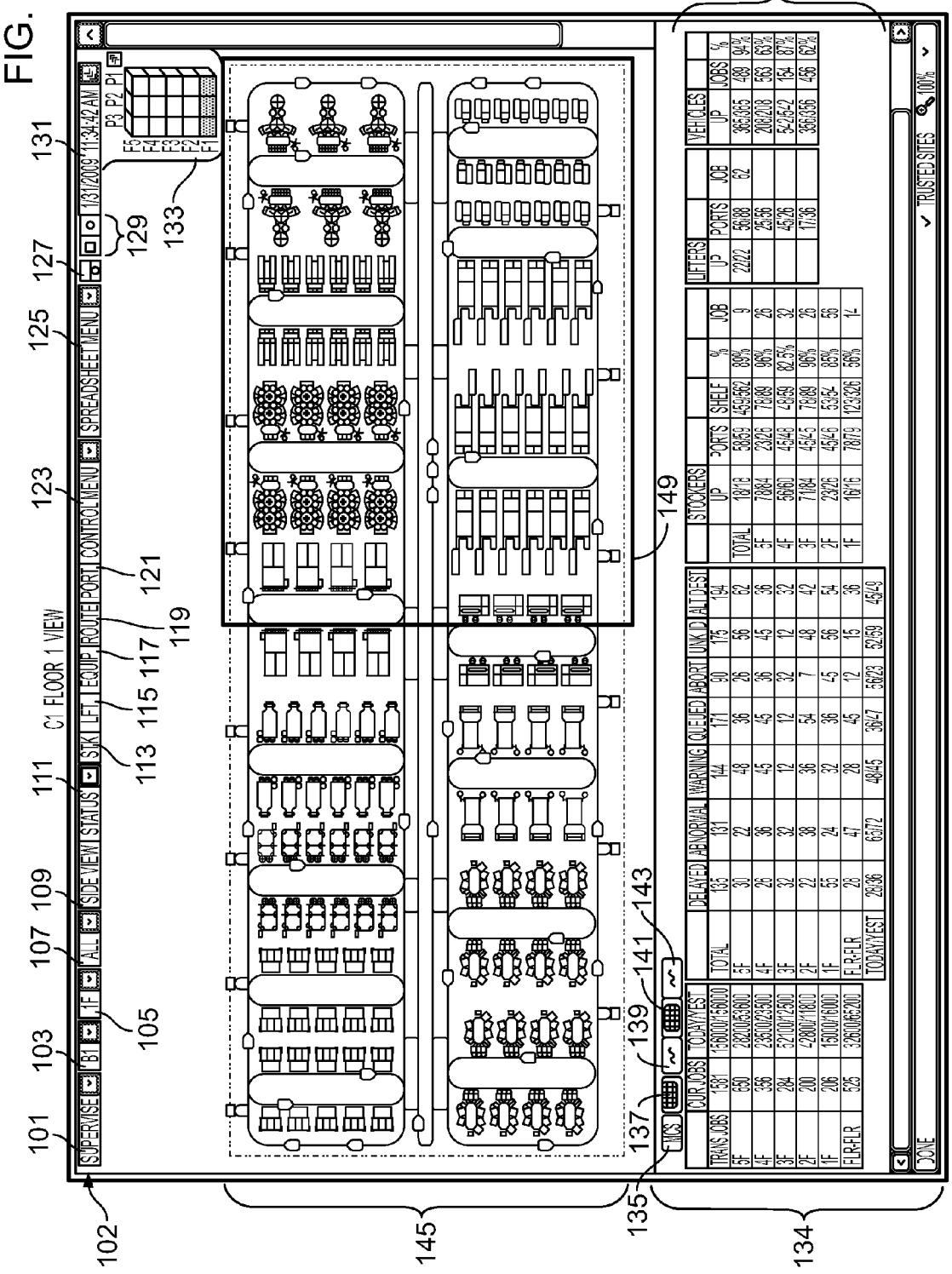
FIG. 4.1

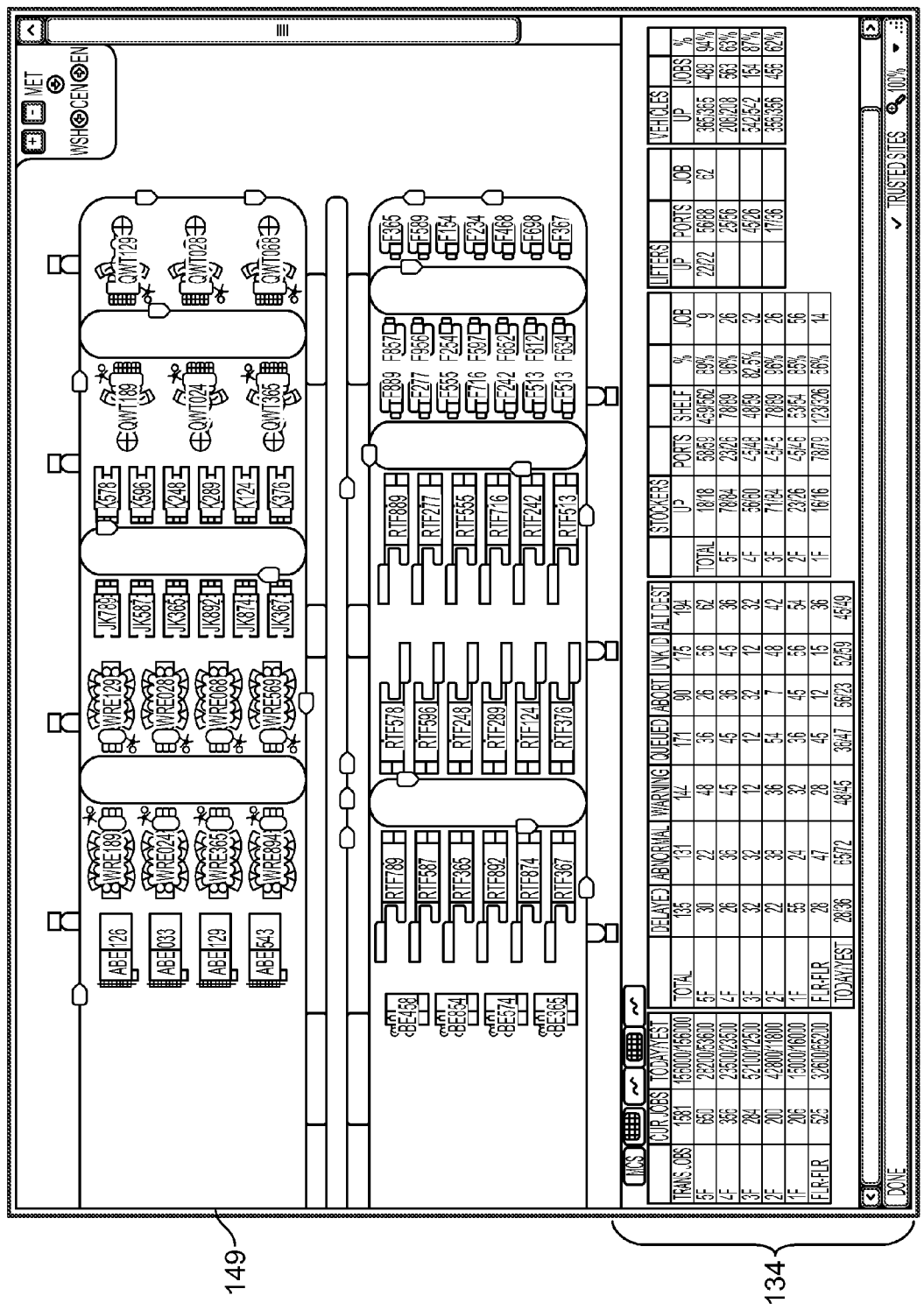
FIG. 4.2

C3 FLOATING TABLES

2009/01/31 14:52:29

HTTP://ASYST-APPS/?FLASHDISPLAYWIDTH=1000&FLASHDISPLAYHEIGHT=400&FLASHBGCOLOR=FFFFFF&FLASHURL=H - WINDOWS INTERNET EXPLORER

| TRANS JOBS | CUR JOBS | TODAY/YEST |
|---|---|---|
|  | 1581 | 156000/156000 |
| 5F | 650 | 28200/53600 |
| 4F | 356 | 23500/23500 |
| 3F | 284 | 52100/12500 |
| 2F | 200 | 42800/11800 |
| 1F | 206 | 15000/16000 |
| FLR-FLR | 525 | 32600/65200 |

|  | DELAYED | ABNORMAL | WARNING | QUEUED | ABORT | UNK ID | ALT DEST |
|---|---|---|---|---|---|---|---|
| TOTAL | 135 | 131 | 144 | 171 | 90 | 175 | 194 |
| 5F | 30 | 22 | 48 | 36 | 26 | 56 | 62 |
| 4F | 26 | 36 | 45 | 45 | 36 | 45 | 36 |
| 3F | 32 | 32 | 12 | 12 | 32 | 12 | 32 |
| 2F | 22 | 38 | 36 | 54 | 7 | 48 | 42 |
| 1F | 55 | 24 | 32 | 36 | 45 | 56 | 54 |
| FLR-FLR | 28 | 47 | 28 | 45 | 12 | 15 | 36 |
| TODAY/YEST | 28/36 | 65/72 | 48/45 | 36/47 | 56/23 | 52/59 | 45/49 |

| STOCKERS | UP | PORTS | SHELF | % | JOB |
|---|---|---|---|---|---|
| TOTAL | 18/18 | 58/59 | 459/562 | 89% | 9 |
| 5F | 78/84 | 23/26 | 78/89 | 96% | 26 |
| 4F | 56/60 | 45/48 | 48/59 | 82.5% | 32 |
| 3F | 71/84 | 45/45 | 78/89 | 96% | 26 |
| 2F | 23/26 | 45/46 | 53/54 | 85% | 56 |
| 1F | 16/16 | 78/79 | 123/326 | 56% | 14 |

| LIFTERS | UP | PORTS | JOB |
|---|---|---|---|
|  | 22/22 | 56/88 | 62 |
|  |  | 25/56 |  |
|  |  | 45/26 |  |
|  |  | 17/36 |  |

| VEHICLES | UP | JOBS | % |
|---|---|---|---|
|  | 365/365 | 489 | 94% |
|  | 208/208 | 563 | 63% |
|  | 542/542 | 154 | 87% |
|  | 356/356 | 456 | 62% |

FIG. 4.3

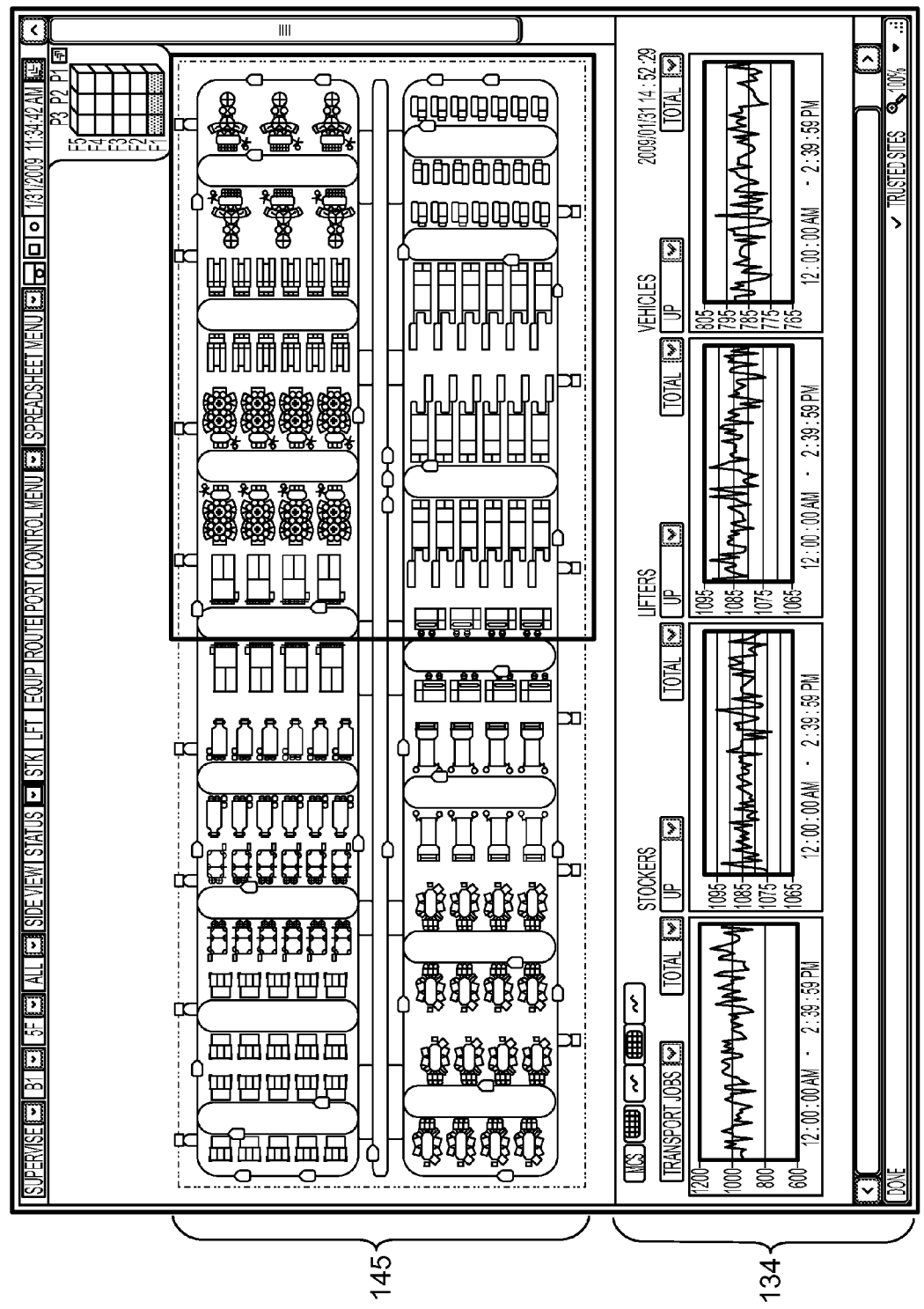
FIG. 4.4

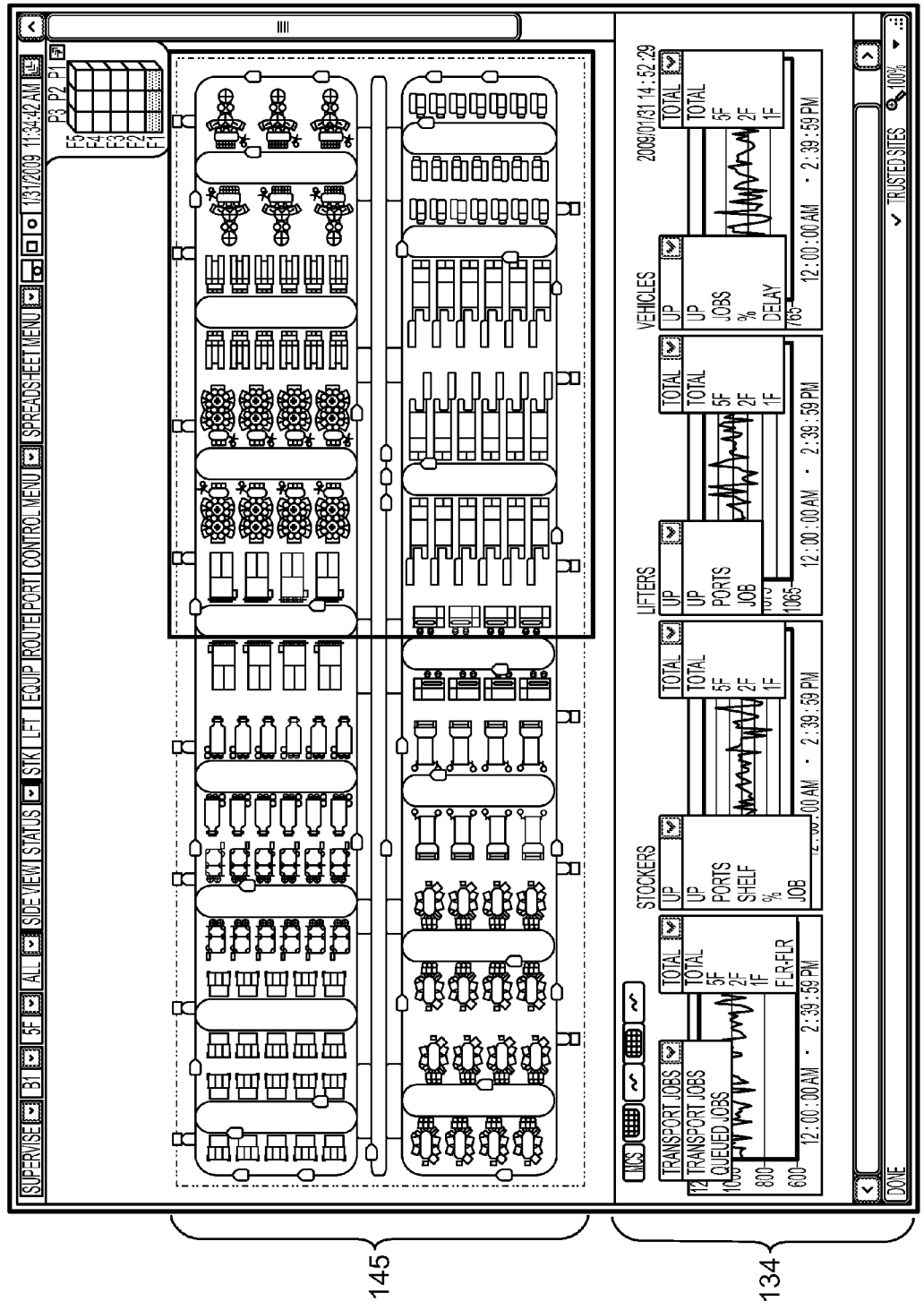
FIG. 4.5

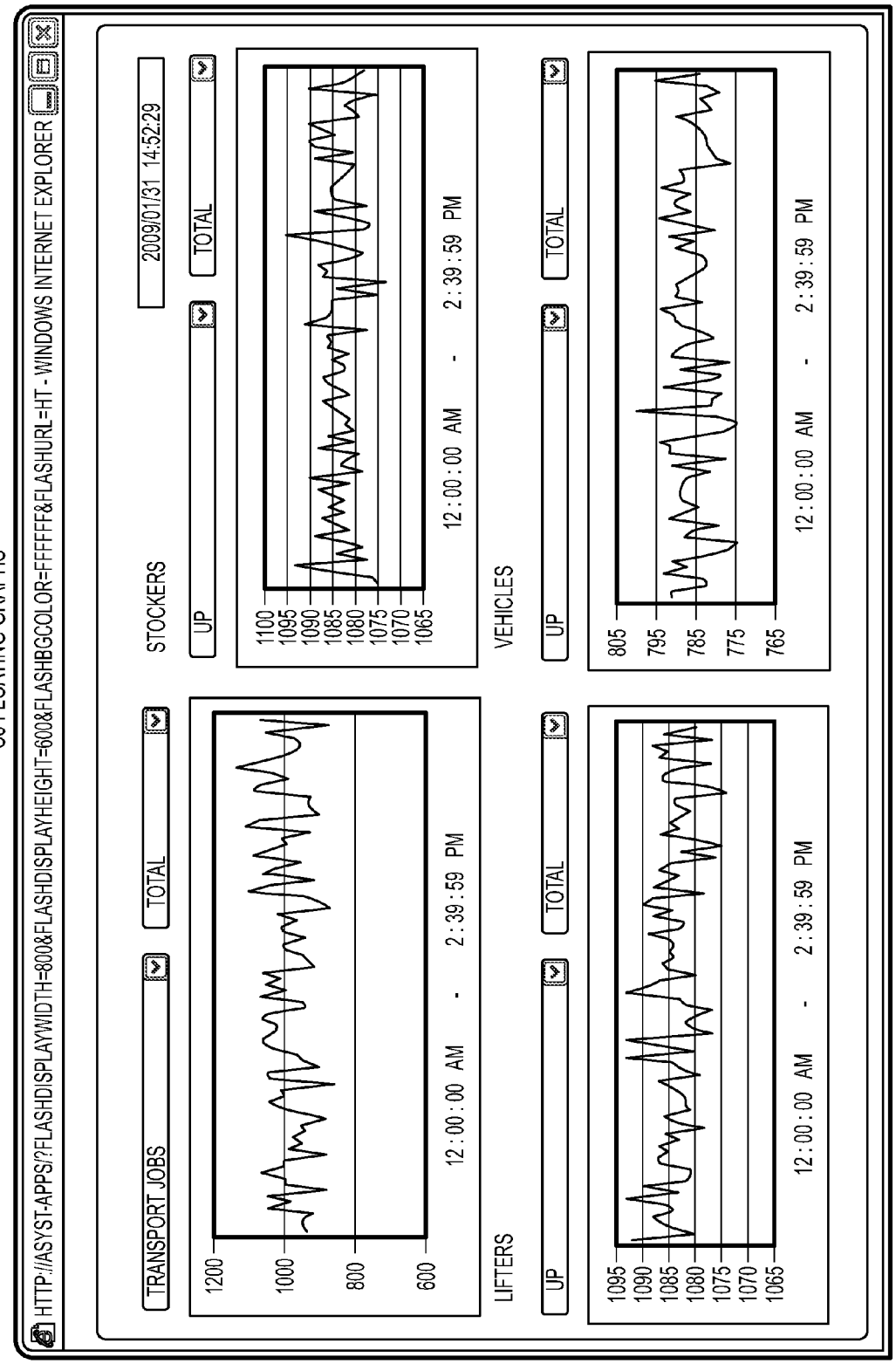
FIG. 4.6

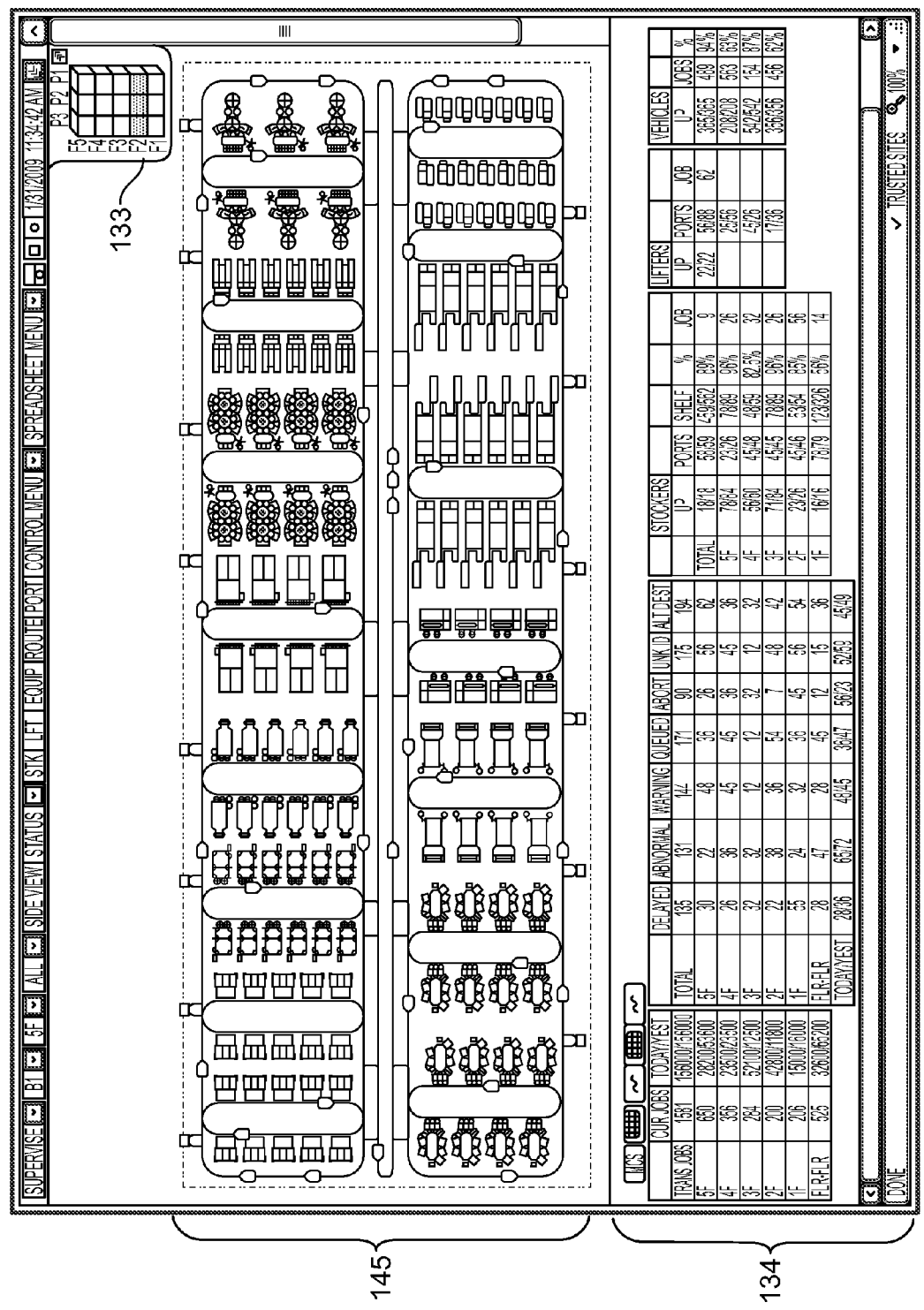
FIG. 4.7

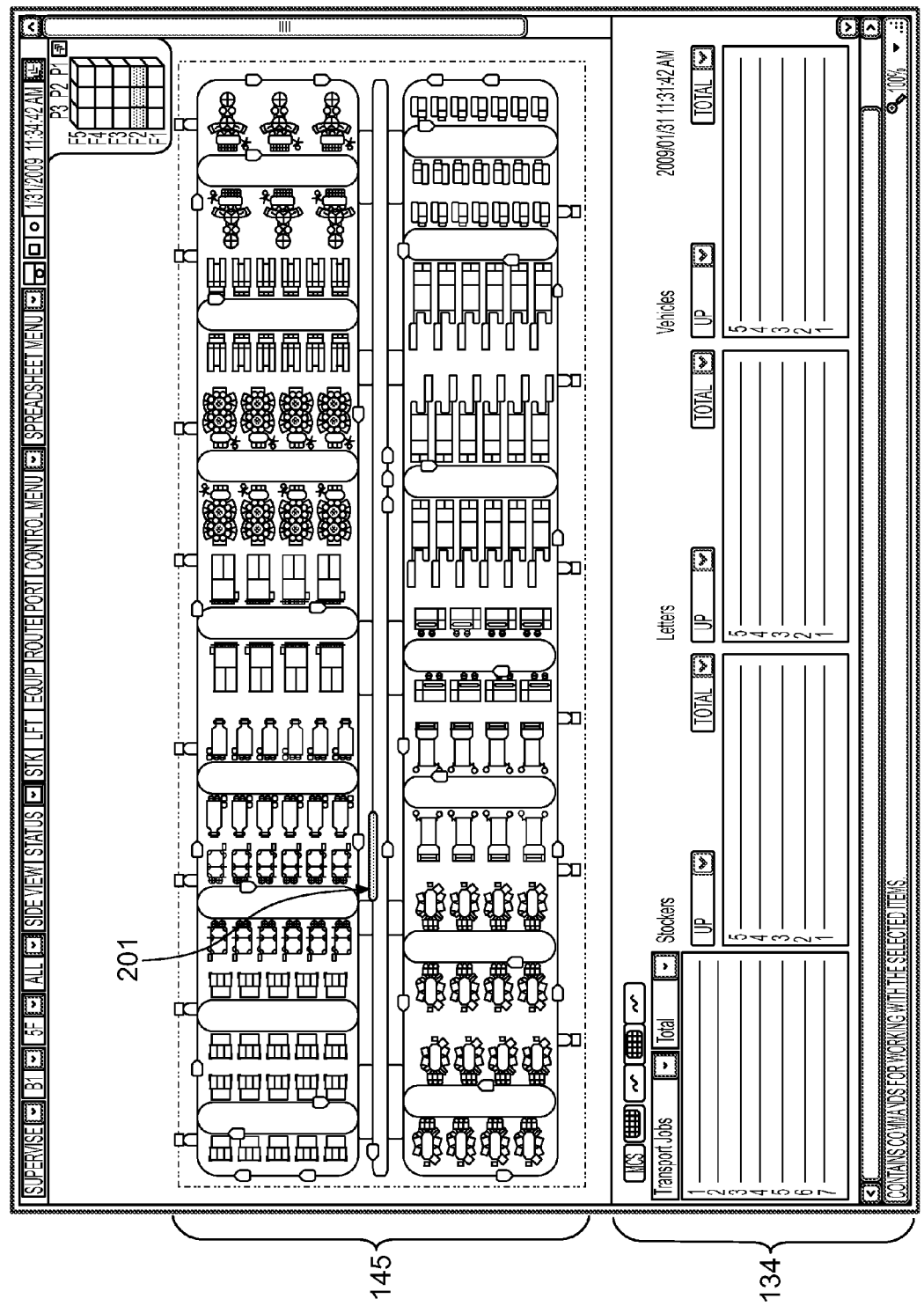
FIG. 4.8

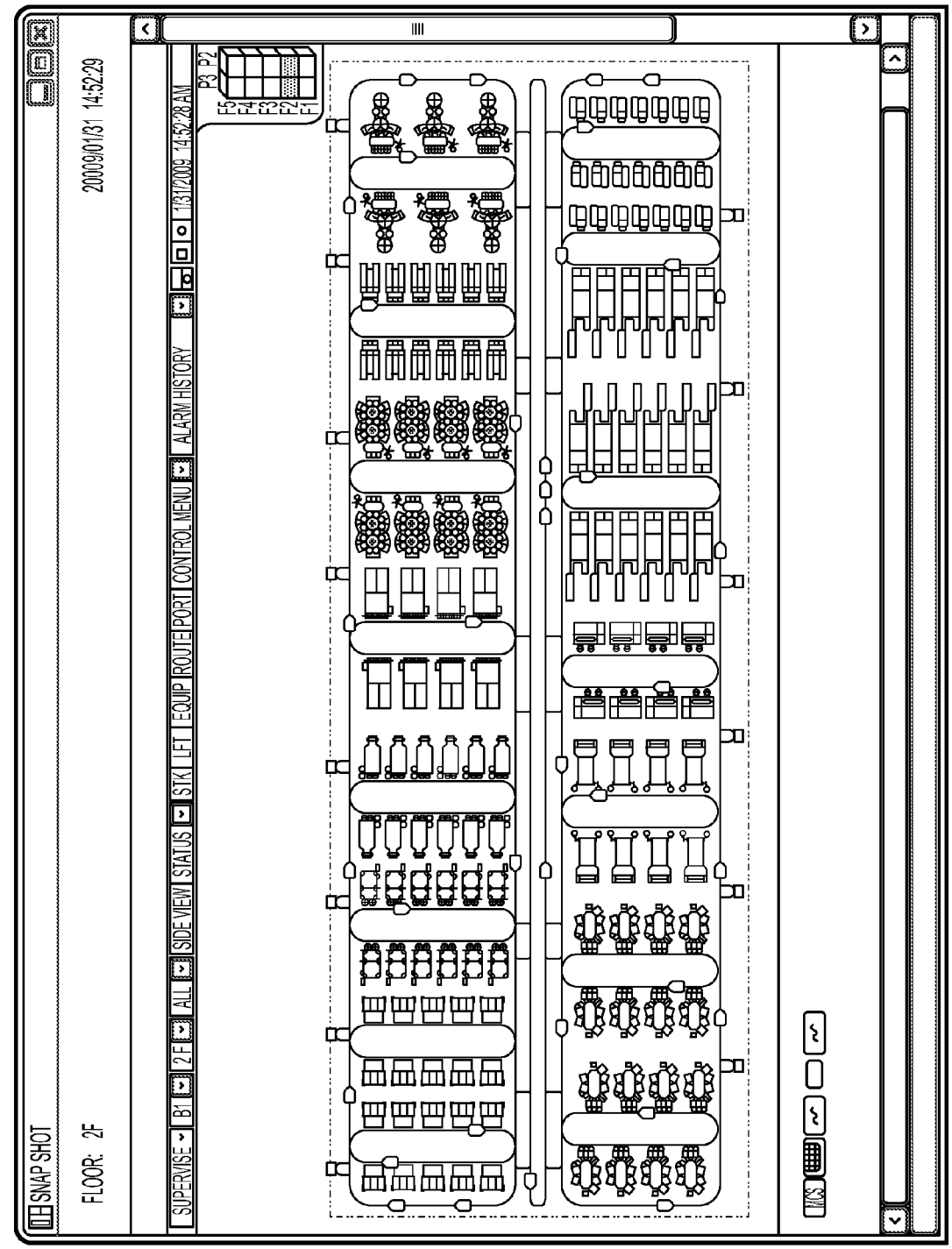
FIG. 4.9

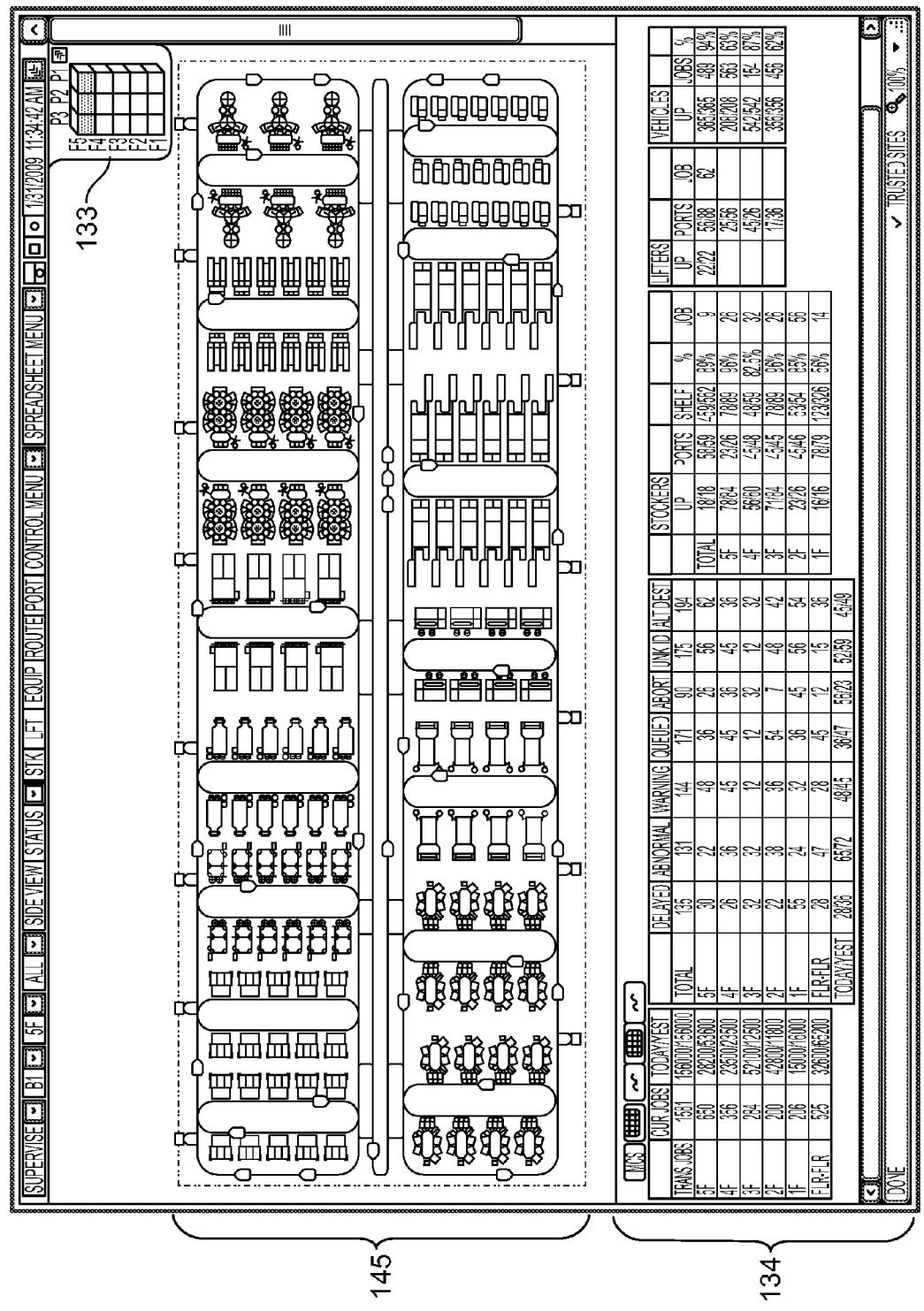
FIG. 4.10

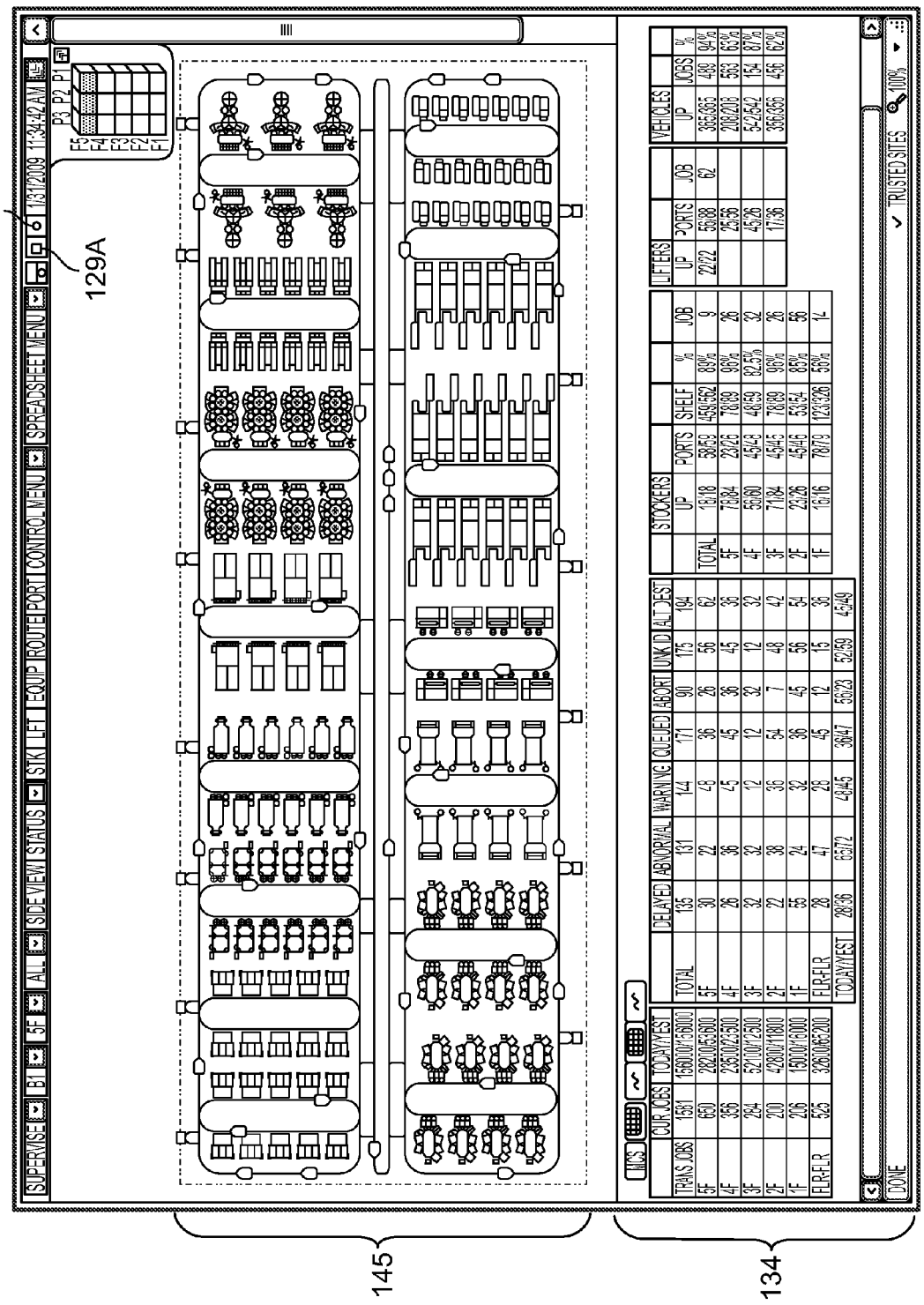
FIG. 4.11

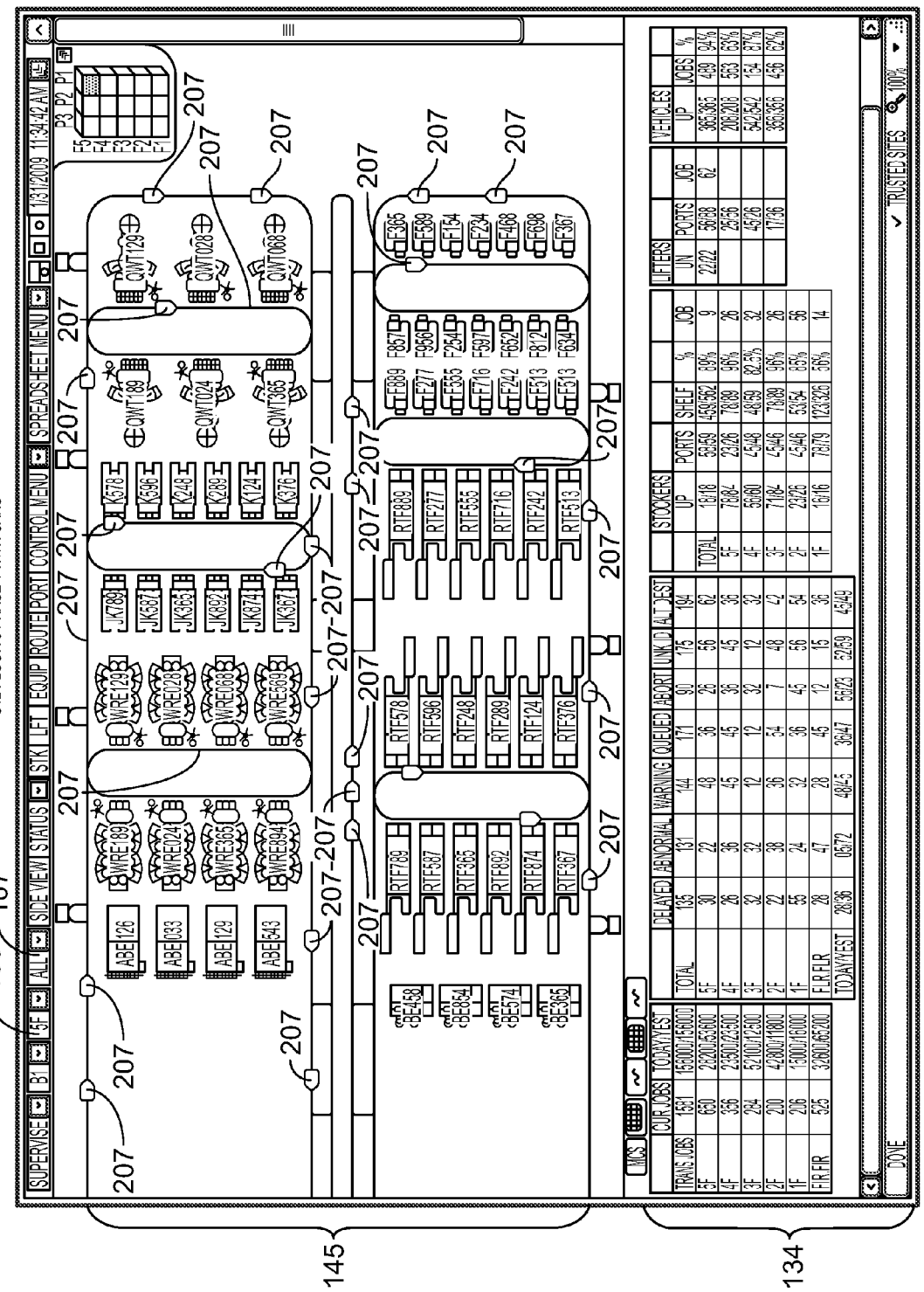
FIG. 4.12

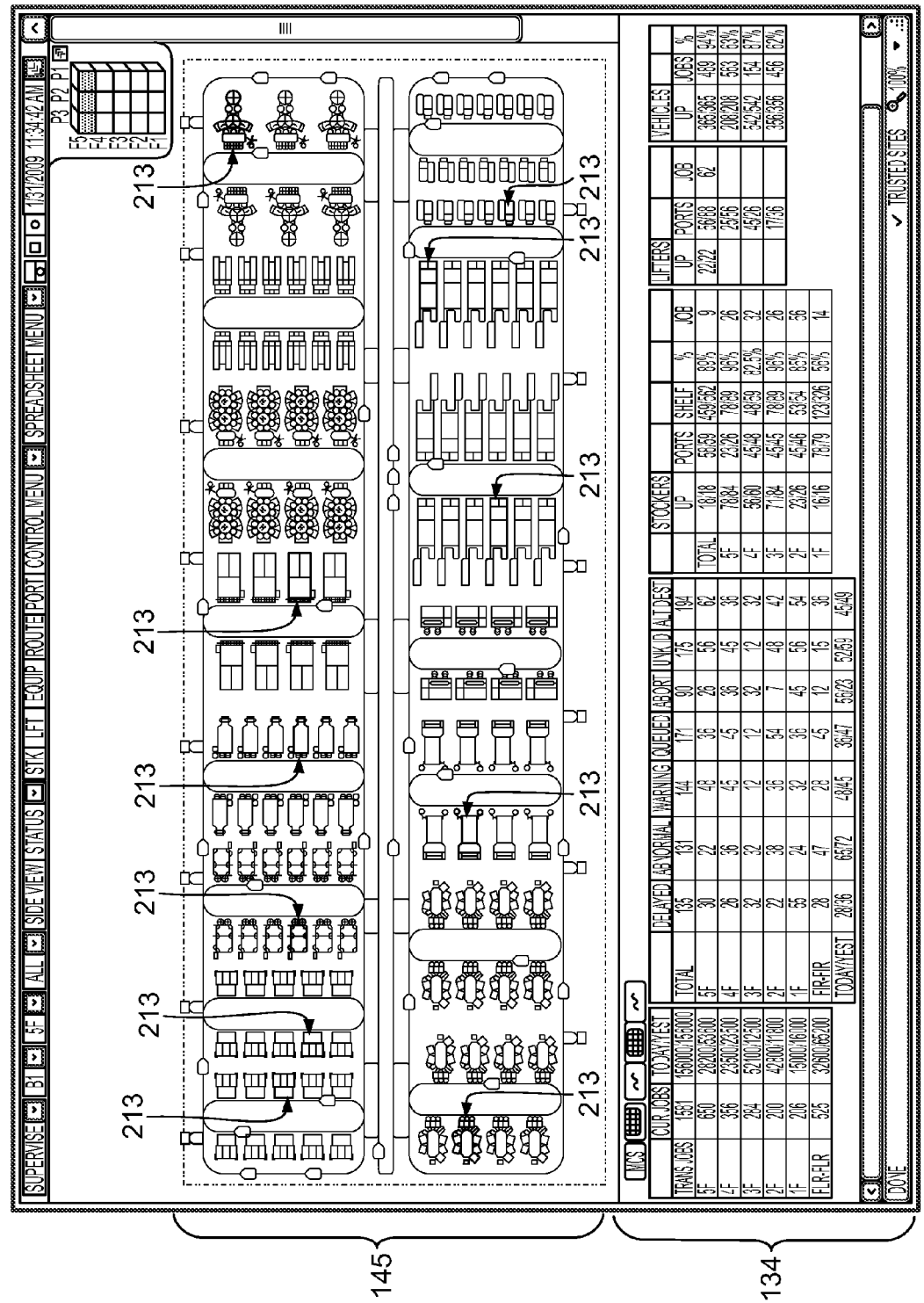
FIG. 4.13

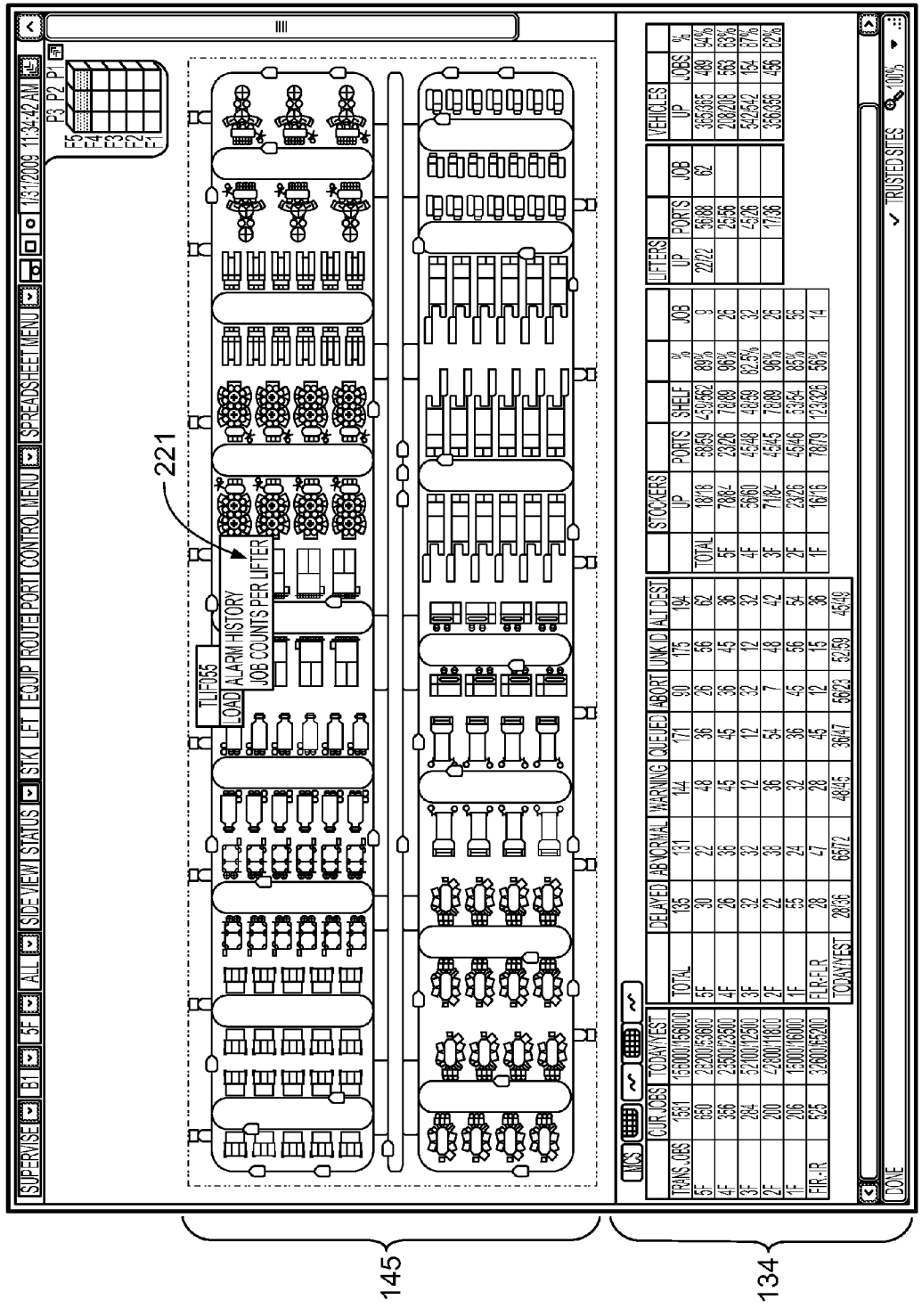
FIG. 4.14

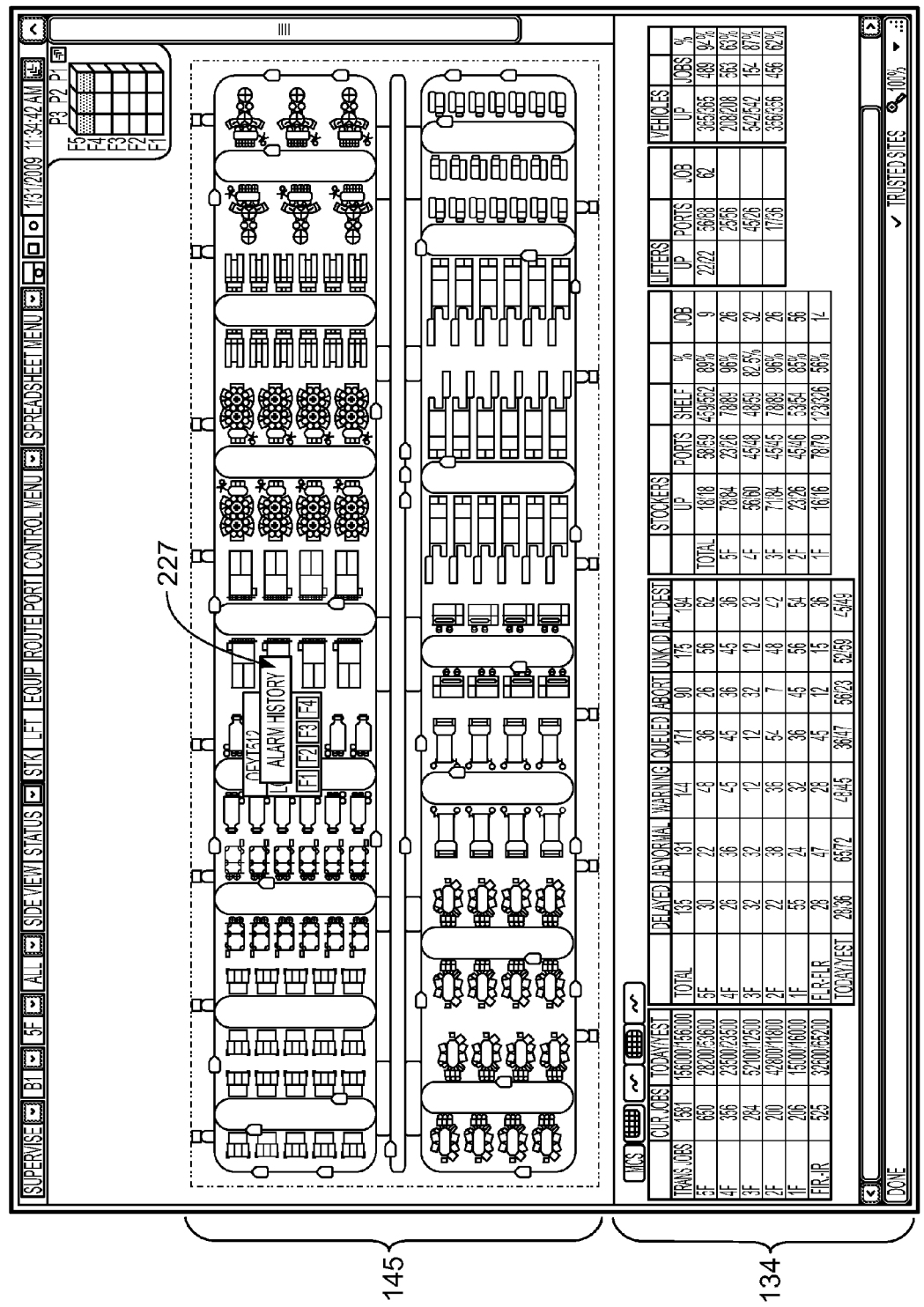
FIG. 4.15 C/S SHOWING TOOL MENU AND ALARM HISTORY

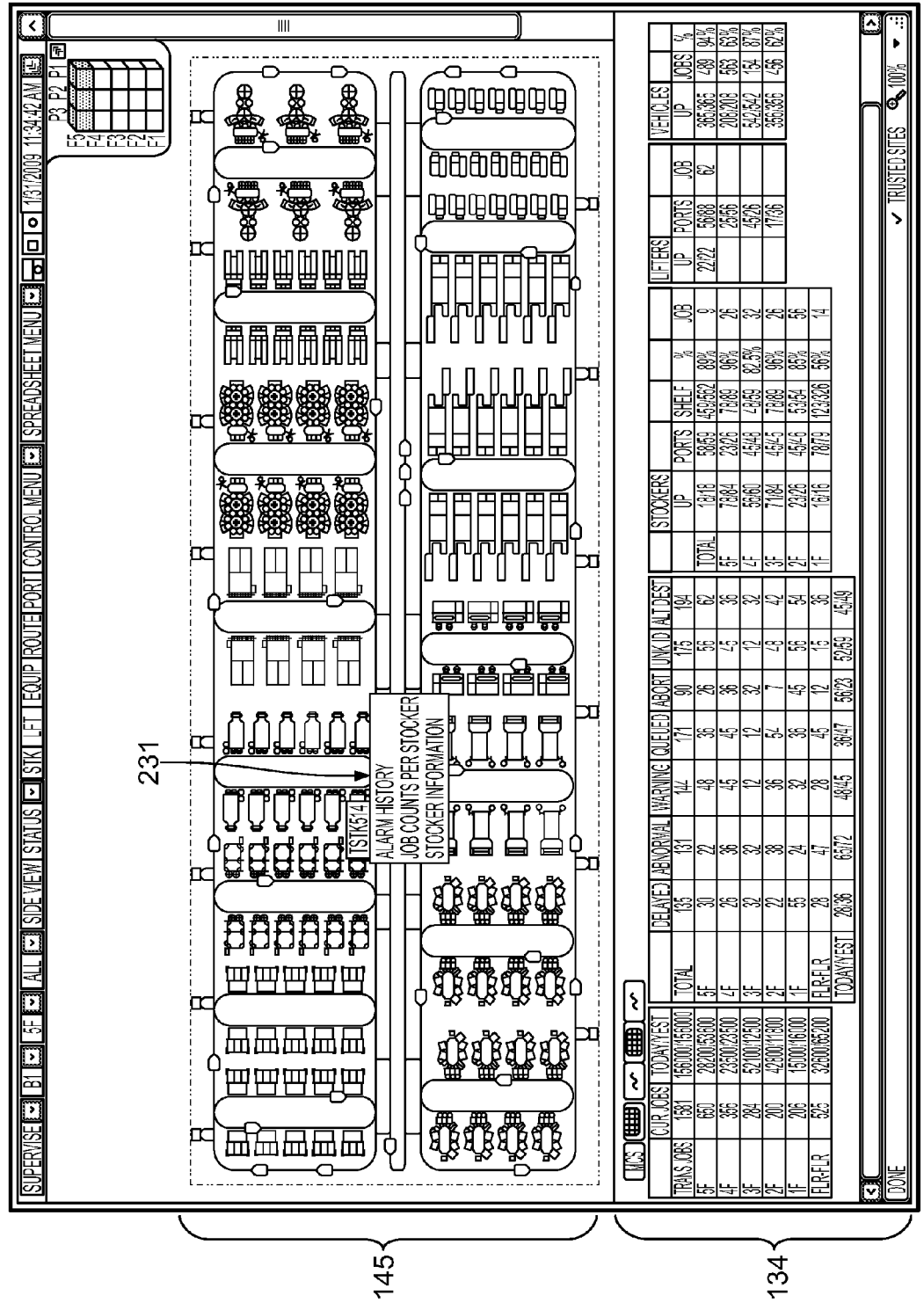
FIG. 4.16

C17 STOCKER INFORMATION

STOCKER INFORMATION               2009/01/31 14:52:29

DISPLAY AREA SETTING : ASO 23-458 ▽     [PRINT]

[BACK]

| STOCKER ID | JOB COUNT | TOTAL SHELF NUMBER | STORAGE CARRIER NUMBER | STORAGE UPPER LIMIT | STORAGE LOWER LIMIT | OCCUPANCY RATIO |
|---|---|---|---|---|---|---|
| STK001 | 2 | 258 | 202 | 158 | 142 | 62.031 |
| STK002 | 8 | 458 | 203 | 254 | 245 | 50.321 |
| STK003 | 8 | 658 | 201 | 125 | 123 | 75.325 |
| STK004 | 6 | 125 | 201 | 415 | 410 | 84.325 |
| STK005 | 4 | 415 | 205 | 212 | 209 | 56.321 |
| STK006 | 2 | 854 | 204 | 425 | 403 | 45.248 |
| STK007 | 7 | 362 | 203 | 582 | 550 | 75.321 |
| STK008 | 9 | 141 | 206 | 124 | 113 | 98.521 |
| STK009 | 6 | 584 | 208 | 236 | 221 | 754.12 |
| STK010 | 3 | 257 | 205 | 854 | 842 | 52.361 |
| STK011 | 5 | 365 | 204 | 254 | 246 | 63.217 |
| STK012 | 2 | 254 | 203 | 325 | 320 | 72.365 |
| STK013 | 1 | 985 | 201 | 152 | 142 | 91.234 |

FIG. 4.17

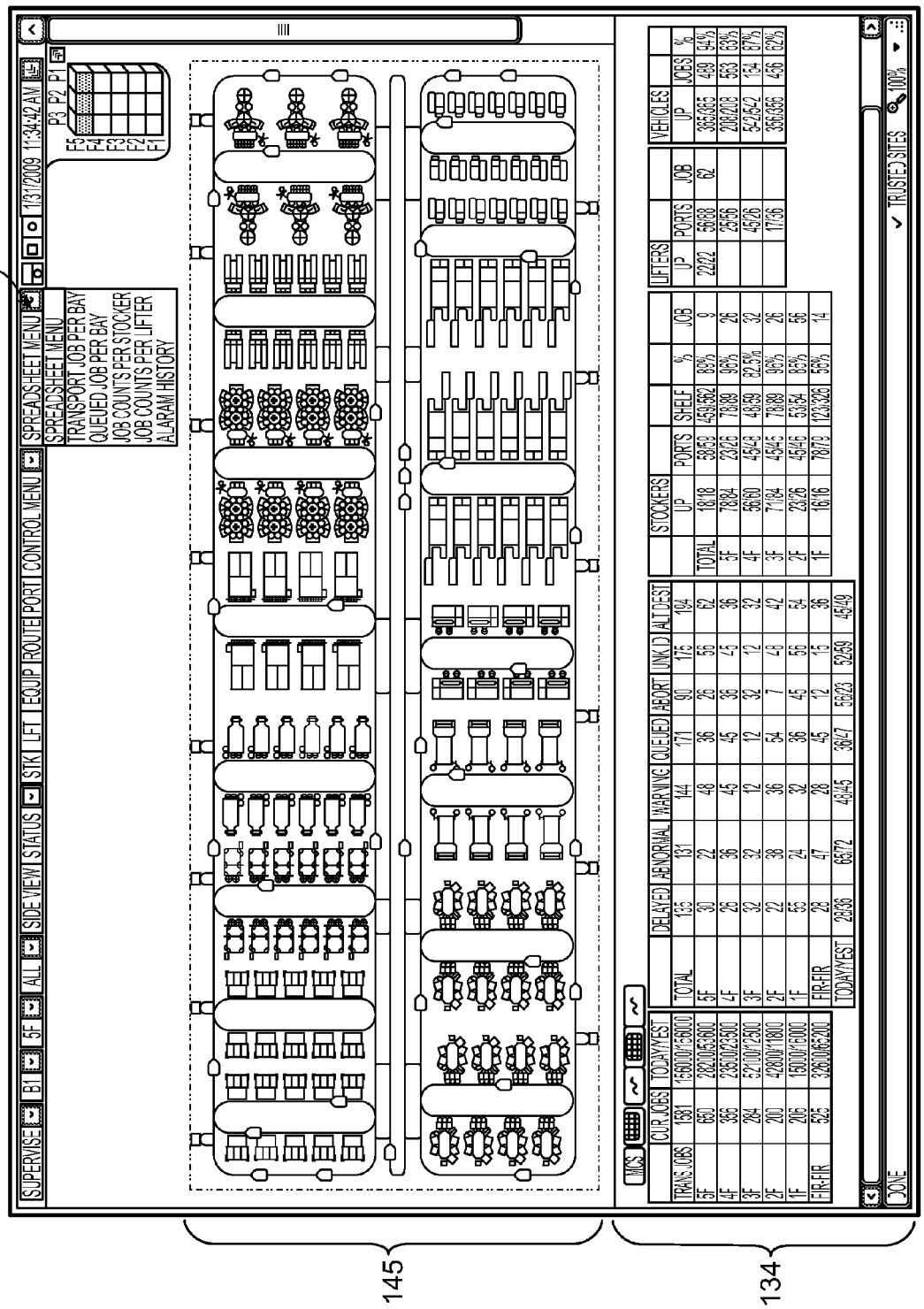
FIG. 4.18

C19 TRANSPORT JOB LIST PER BAY

HTTP://ASYST-APPS/?SELECTEDBAY=FALSE&FLOORNAME=5F&FLOORID=11500&LANGUAGE=EN - TRANSPORT JOB LIS - WINDOWS INTERNET EXPLORER

TRANSPORT JOB LIST PER BAY

2009/01/31 11:47:00

FLOOR : 4F   START TIME : 2009/01/30 11:47:00   END TIME : 2009/01/31 11:47:00   CURRENT TIME

BACK   REFRESH   PRINT

| TO/FROM | BAY 01 | BAY 02 | BAY 03 | BAY 04 | BAY 05 | BAY 06 | BAY 07 | BAY 08 | BAY 09 | BAY 10 | BAY 11 | BAY 12 | BAY 13 | TO TOTAL |
|---|---|---|---|---|---|---|---|---|---|---|---|---|---|---|
| BAY 01 | 0 | 0 | 0 | 0 | 0 | 0 | 0 | 0 | 0 | 0 | 0 | 0 | 0 | 0 |
| BAY 02 | 0 | 1 | 1 | 1 | 0 | 1 | 0 | 0 | 0 | 1 | 1 | 1 | 1 | 10 |
| BAY 03 | 0 | 0 | 0 | 0 | 0 | 0 | 0 | 0 | 0 | 0 | 0 | 0 | 0 | 0 |
| BAY 04 | 1 | 1 | 1 | 1 | 1 | 1 | 1 | 1 | 1 | 1 | 1 | 1 | 1 | 13 |
| BAY 05 | 0 | 0 | 0 | 0 | 0 | 0 | 0 | 0 | 0 | 0 | 0 | 0 | 0 | 0 |
| BAY 06 | 0 | 1 | 1 | 0 | 1 | 1 | 1 | 1 | 0 | 0 | 0 | 0 | 1 | 7 |
| BAY 07 | 1 | 1 | 0 | 1 | 0 | 1 | 0 | 0 | 0 | 1 | 1 | 1 | 1 | 10 |
| BAY 08 | 0 | 1 | 1 | 0 | 1 | 0 | 0 | 0 | 0 | 0 | 0 | 0 | 0 | 0 |
| BAY 09 | 0 | 0 | 0 | 1 | 0 | 1 | 1 | 1 | 1 | 1 | 0 | 0 | 1 | 7 |
| BAY 10 | 1 | 1 | 0 | 1 | 1 | 1 | 1 | 1 | 1 | 1 | 1 | 1 | 1 | 13 |
| BAY 11 | 1 | 0 | 0 | 0 | 0 | 0 | 0 | 0 | 0 | 1 | 0 | 0 | 1 | 3 |
| BAY 12 | 0 | 1 | 1 | 1 | 1 | 1 | 1 | 1 | 1 | 1 | 1 | 1 | 1 | 13 |
| BAY 13 | 1 | 1 | 0 | 0 | 0 | 0 | 0 | 0 | 0 | 0 | 0 | 0 | 0 | 0 |
| OTHER FLOORS | 1 | 1 | 0 | 1 | 1 | 1 | 0 | 1 | 1 | 1 | 0 | 1 | 1 | 10 |
| FROM TOTAL | 6 | 8 | 5 | 7 | 6 | 8 | 5 | 7 | 6 | 8 | 5 | 7 | 8 | |

FIG. 4.19

C20 QUEUED JOB LIST PER BAY

HTTP://ASYST-APPS/?SELECTEDBAY=FALSE&FLOORNAME=1F&FLOORID=11100&LANGUAGE=EN - QUEUED JOB LIST P - WINDOWS INTERNET EXPLORER

2009/01/31 11:47:00

QUEUED JOB LIST PER BAY

BACK

FLOOR: 4F

PRINT

| TO/FROM | BAY 01 | BAY 02 | BAY 03 | BAY 04 | BAY 05 | BAY 06 | BAY 07 | BAY 08 | BAY 09 | BAY 10 | BAY 11 | BAY 12 | BAY 13 | TO TOTAL |
|---|---|---|---|---|---|---|---|---|---|---|---|---|---|---|
| BAY 01 | 0 | 0 | 0 | 0 | 0 | 4 | 0 | 0 | 0 | 0 | 0 | 0 | 0 | 4 |
| BAY 02 | 5 | 1 | 1 | 1 | 6 | 1 | 1 | 1 | 0 | 1 | 1 | 1 | 1 | 21 |
| BAY 03 | 0 | 0 | 0 | 4 | 0 | 0 | 0 | 0 | 5 | 0 | 0 | 5 | 0 | 14 |
| BAY 04 | 1 | 1 | 1 | 1 | 1 | 0 | 0 | 1 | 1 | 0 | 1 | 1 | 1 | 13 |
| BAY 05 | 0 | 0 | 5 | 0 | 0 | 0 | 0 | 0 | 0 | 1 | 1 | 0 | 0 | 5 |
| BAY 06 | 0 | 1 | 1 | 1 | 1 | 1 | 5 | 1 | 0 | 1 | 0 | 1 | 1 | 14 |
| BAY 07 | 1 | 1 | 0 | 0 | 1 | 0 | 0 | 0 | 5 | 1 | 0 | 0 | 0 | 5 |
| BAY 08 | 0 | 0 | 0 | 1 | 1 | 1 | 0 | 1 | 0 | 0 | 1 | 5 | 1 | 14 |
| BAY 09 | 4 | 1 | 1 | 0 | 0 | 0 | 4 | 1 | 0 | 4 | 1 | 1 | 1 | 19 |
| BAY 10 | 1 | 0 | 0 | 1 | 1 | 1 | 0 | 0 | 1 | 0 | 0 | 0 | 0 | 3 |
| BAY 11 | 1 | 1 | 1 | 0 | 0 | 0 | 1 | 0 | 1 | 0 | 1 | 4 | 1 | 16 |
| BAY 12 | 0 | 0 | 0 | 1 | 1 | 0 | 1 | 0 | 0 | 0 | 0 | 0 | 0 | 4 |
| BAY 13 | | | | | | | | | | | | | | |
| FROM TOTAL | 13 | 7 | 10 | 14 | 16 | 11 | 12 | 6 | 14 | 10 | 5 | 18 | 7 | |

FIG. 4.20

JOB COUNTS PER STOCKER

STOCKER ID: ALL  START TIME: 2009/01/30 11:47:00  END TIME: 2009/01/31 11:47:00  CURRENT TIME: 2009/01/31 11:47:00

| STOCKER ID | TIME & DATE | JOB COUNT | THROUGH JOB COUNT | STORAGE CARRIER NUMBER | STORAGE UPPER LIMIT | STORAGE LOWER LIMIT | OCCUPANCY RATIO |
|---|---|---|---|---|---|---|---|
| STKR001 | 2009/01/31 14:41:00 | 2 | 2 | 125 | 158 | 142 | 62.031 |
| STKR002 | 2009/01/31 14:41:00 | 6 | 0 | 214 | 254 | 245 | 50.321 |
| STKR003 | 2009/01/31 14:41:00 | 5 | 3 | 254 | 125 | 123 | 75.325 |
| STKR004 | 2009/01/31 14:41:00 | 6 | 1 | 235 | 415 | 410 | 84.325 |
| STKR005 | 2009/01/31 14:41:00 | 15 | 2 | 126 | 212 | 209 | 56.321 |
| STKR006 | 2009/01/31 14:41:00 | 8 | 3 | 145 | 425 | 403 | 45.248 |
| STKR007 | 2009/01/31 14:41:00 | 15 | 0 | 325 | 582 | 550 | 75.321 |
| STKR008 | 2009/01/31 14:41:00 | 0 | 5 | 154 | 124 | 113 | 98.521 |
| STKR009 | 2009/01/31 14:41:00 | 14 | 0 | 135 | 236 | 221 | 754.12 |
| STKR010 | 2009/01/31 14:41:00 | 3 | 1 | 147 | 854 | 842 | 52.361 |
| STKR011 | 2009/01/31 14:41:00 | 6 | 0 | 241 | 254 | 246 | 63.217 |

FIG. 4.21

C22 JOB COUNTS PER LIFTER

JOB COUNTS PER LIFTER

LIFTER ID: ALL　　START TIME: 2009/01/30 11:47:00　　END TIME: 2009/01/31 11:47:00　　CURRENT TIME 2009/01/31 11:47:00

| LIFTER ID | DATE & TIME | JOB COUNT | THROUGH JOB COUNT |
|---|---|---|---|
| LFTR001 | 2009/01/31 14:41:00 | 2 | 2 |
| LFTR002 | 2009/01/31 14:41:00 | 8 | 8 |
| LFTR003 | 2009/01/31 14:41:00 | 8 | 8 |
| LFTR004 | 2009/01/31 14:41:00 | 6 | 6 |
| LFTR005 | 2009/01/31 14:41:00 | 4 | 4 |
| LFTR006 | 2009/01/31 14:41:00 | 2 | 2 |
| LFTR007 | 2009/01/31 14:41:00 | 7 | 7 |
| LFTR008 | 2009/01/31 14:41:00 | 9 | 9 |
| LFTR009 | 2009/01/31 14:41:00 | 6 | 6 |
| LFTR010 | 2009/01/31 14:41:00 | 3 | 3 |
| LFTR011 | 2009/01/31 14:41:00 | 5 | 5 |
| LFTR012 | 2009/01/31 14:41:00 | 2 | 2 |
| LFTR013 | 2009/01/31 14:41:00 | 1 | 1 |

FIG. 4.22

C23 ALARM HISTORY

HTTP://ASYST-APPS/?PARENTSCREEN=TOPVIEWFLOORWITHLIFTERID&FLOORNAME=2F&FLOOR=1120&PHASE=0&LANGU - WINDOWS INTERNET EXPLORER

2009/01/31 11:47:00

ALARM HISTORY

TOOLS: ALL ▼   START TIME: 2009/01/30 11:47:00   END TIME: 2009/01/31 11:47:00   CURRENT TIME

BACK   REFRESH   PRINT

| TIME & DATE | TOOL/ CONTROLLER | ALARM ID | ALARM LEVEL | DETAIL |
|---|---|---|---|---|
| 2009/01/31 14:41:00 | STOCKER001 | 96523 | WARNING | HANDOFF ERROR |
| 2009/01/31 14:41:00 | STOCKER009 | 96523 | WARNING | AMHS CONTROLLER NOT AVAILABLE CONTROLLER |
| 2009/01/31 14:41:00 | LIFTER005 | 1254 | WARNING | AMHS CONTROLLER NOT AVAILABLE CONTROLLER |
| 2009/01/31 14:41:00 | STOCKER006 | 96523 | WARNING | AMHS CONTROLLER NOT AVAILABLE CONTROLLER |
| 2009/01/31 14:41:00 | LIFTER006 | 1254 | WARNING | HANDOFF ERROR |
| 2009/01/31 14:41:00 | STOCKER016 | 96523 | WARNING | AMHS CONTROLLER NOT AVAILABLE CONTROLLER |
| 2009/01/31 14:41:00 | STOCKER018 | 96523 | WARNING | AMHS CONTROLLER NOT AVAILABLE CONTROLLER |
| 2009/01/31 14:41:00 | LIFTER007 | 1254 | WARNING | AMHS CONTROLLER NOT AVAILABLE CONTROLLER |
| 2009/01/31 14:41:00 | LIFTER023 | 1254 | WARNING | AMHS CONTROLLER NOT AVAILABLE CONTROLLER |
| 2009/01/31 14:41:00 | STOCKER025 | 96523 | ALARM | AMHS CONTROLLER NOT AVAILABLE CONTROLLER |
| 2009/01/31 14:41:00 | STOCKER087 | 96523 | ALARM | HANDOFF ERROR |

FIG. 4.23

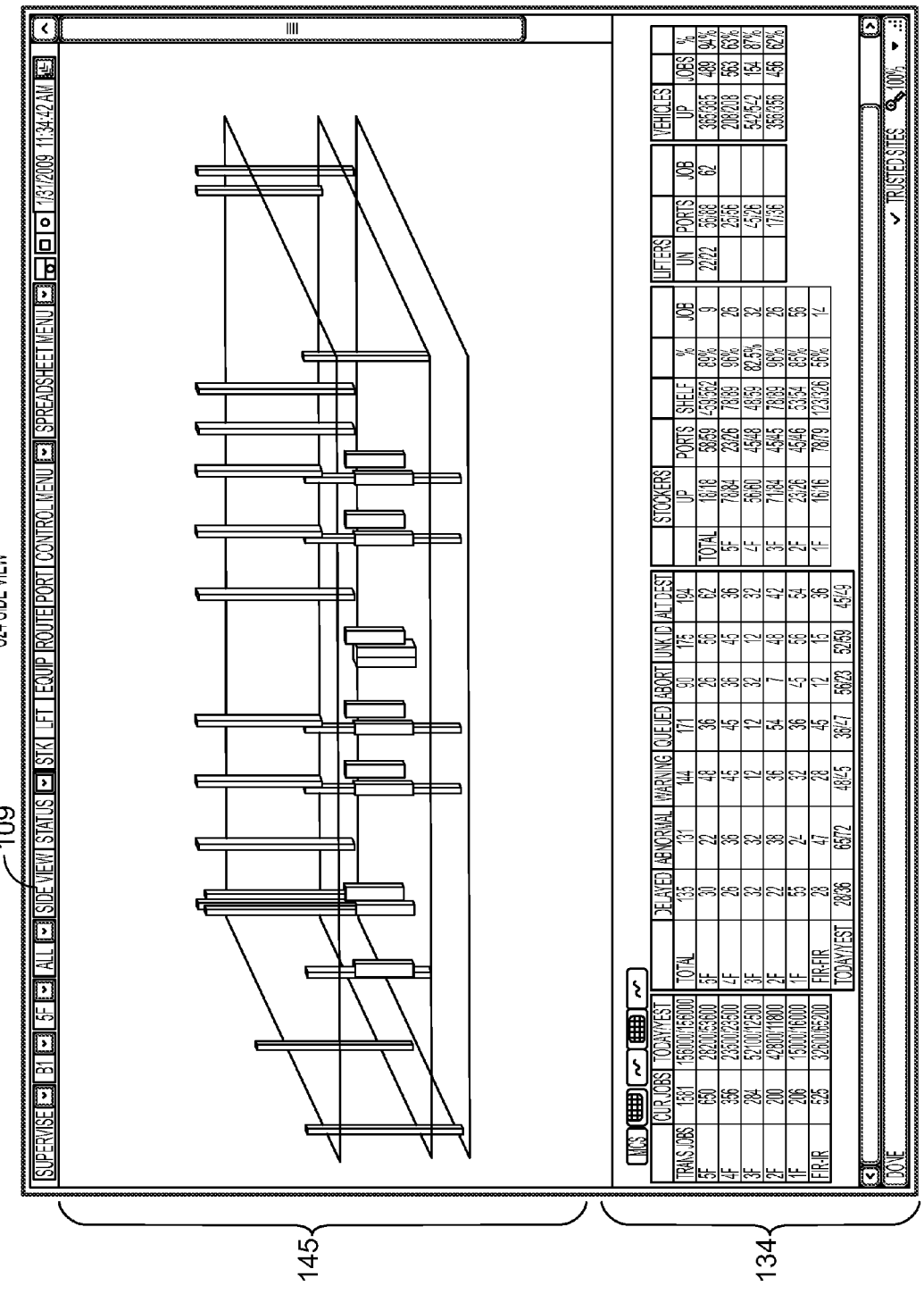
FIG. 4.24

SEMICONDUCTOR FABRICATION FACILITY VISUALIZATION SYSTEM WITH PERFORMANCE OPTIMIZATION

CLAIM OF PRIORITY

This application claims priority under 35 U.S.C. 119(e) to U.S. Provisional Patent Application No. 61/030,847, filed Feb. 22, 2008, entitled "VAO Productivity Suite," and to U.S. Provisional Patent Application No. 61/037,298, filed Mar. 17, 2008, entitled "VAO Productivity Suite." The disclosure of each above-identified provisional patent application is incorporated herein by reference.

BACKGROUND

Modern semiconductor factories use a variety of automation systems from multiple independent suppliers. As used herein, the terms semiconductor factory and semiconductor fab are synonymous, and are respectively abbreviated as factory and fab. The various independent automation systems include hardware and software that are interfaced to work together to automate the movement of material, data, and control through the fab. Major independent automation systems in the fab may include: MES (Manufacturing Execution System), AMHS (Automated Material Handling System), MCS (Material Control System), station Control for tool connectivity, EFEMs (Equipment Front-End Modules) and loadports for interface between factory tools and the AMHS, material tracking systems like radiofrequency identifier (RFID) and barcode, and associated independent software products that may or may not be used in a factory and may or may not be bundled together to handle functions like fault detection, recipe management, scheduling and dispatch, statistical process control (SPC), and others.

Although the various automation systems are defined to work independently in a particular fab, there is currently no single automation system that aggregates data and control on a fab-wide basis. The result is that the productivity of the entire system, i.e., of the entire fab, may not be optimized even when the independent automation systems are functioning effectively. While the independent automation systems may not directly impact the yield of semiconductor devices per wafer, the independent automation systems do impact overall fab productivity in the areas of cycle time, throughput, WIP (Work-In-Progress) levels, material handling, etc.

When a new fab comes online or when fabrication of a new chip design begins, issues and problems may exist in the fab which adversely affect device, i.e., chip, yield per wafer. Therefore, at the beginning of fab life or at the beginning of a new product fabrication ramp, a major focus of the fab is on improvement in device yield per wafer. As device yield improves, the focus of the fab may turn more toward improvement in fab logistics and productivity. Improvement in fab logistics can be of particular concern with regard to fabrication of larger wafers. For example, fabrication of 300 mm and larger wafers requires more automated transport through the fab, thereby benefiting from improved fab logistics. Also, fabrication of smaller technology node devices having decreased line widths may require more process steps, which in turn requires more automated transport through the fab and increases the complexity of cycle time control in the fab. Therefore, improvement in fab logistics can also benefit fabrication of smaller technology node devices.

SUMMARY

In one embodiment, a semiconductor fabrication facility (fab) visualization system is disclosed. The fab visualization system includes a fab configuration module defined to virtually model physical systems and attributes of the fab to be monitored. Also, a data acquisition module is defined to interface with the physical systems of the fab and to gather operational data from the physical systems. A visualizer module is defined to collect and aggregate the operational data gathered from the physical systems. The visualizer module is further defined to process the operational data into a format suitable for visual rendering. The fab visualization system also includes a graphical user interface (GUI) that is controlled by the visualizer module to display the processed operational data within a visual context of the fabrication facility.

In one embodiment, a semiconductor fabrication facility (fab) productivity system is disclosed. The system includes a visualizer module defined to collect, filter, and present fab data through a GUI. The system also includes an analyzer module defined to analyze data collected by the visualizer module to resolve queries regarding fabrication facility performance. The system further includes an optimizer module defined to control systems within the fab in response to data collected by the visualizer module, data generated by the analyzer module, or a combination thereof.

In one embodiment, a method is disclosed for monitoring semiconductor fabrication facility (fab) operations. The method includes an operation for acquiring operational data from different systems within a fabrication facility. The method also includes an operation for aggregating the acquired operational data. The method further includes an operation for rendering the aggregated operational data in a GUI within a visual context of the fab.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3C shows an expression of the Dijkstra algorithm, in accordance with one embodiment of the present invention;

FIGS. 4.1-4.24 show a number of screenshots of various GUIs generated by the VAO system, in accordance with various embodiments of the present invention.

DETAILED DESCRIPTION

Figure 1A:
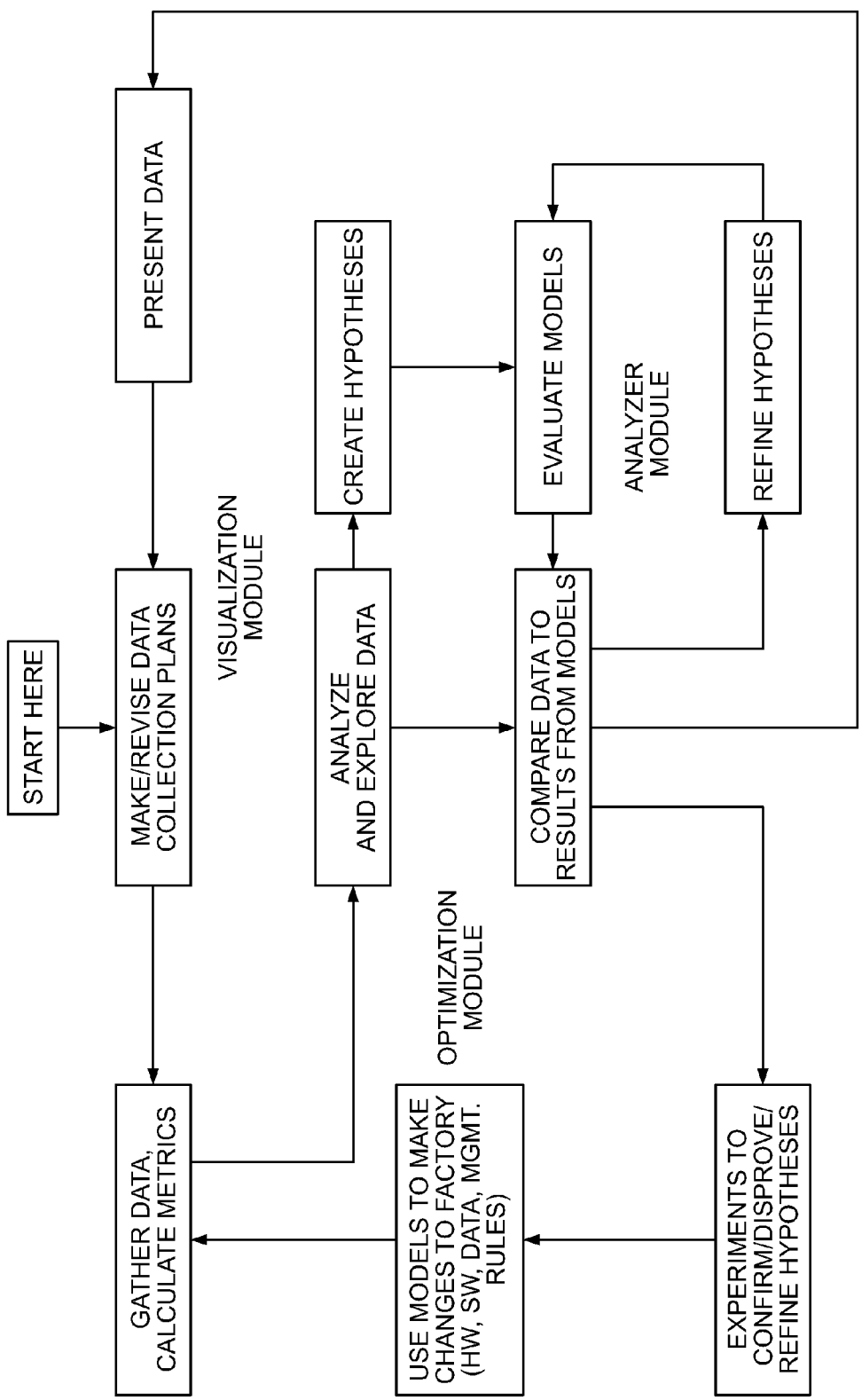
FIG. 1A is an illustration showing an overview of the VAO system operational flow, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Acronym Definitions
- AGV: Automated Guided Vehicle
- AMHS: Automated Material Handling System
- BKM: Best Known Method—industrial best practices
- DB: Database
- EDA: Electronic Design Automation
- EFEM: Equipment Front-End Module—In automated semiconductor equipment, that section of the tool which moves wafers between the carriers on the loadports to the loadlocks and/or process chambers.
- FDIM: Factory Data Integration Manager—product that coordinates equipment data to factory data systems.
- FOSB: Front-Opening Shipping Box—carrier for transporting semiconductor wafers between facilities.
- FOUP: Front-Opening Unified Pod—carrier for transporting semiconductor wafers in fab.
- GUI: Graphical User Interface
- ID: Identifier
- LFC: Lifter/Elevator and/or its corresponding controller
- MES: Manufacturing Execution System
- MCS: Material Control System
- MOHVC: Master Overhead Vehicle Controller
- OHT: Overhead Hoist Transport (form of AMHS)
- OHV: Overhead Hoist Vehicle
- OHVC: Overhead Hoist Vehicle Controller
- PM: Preventive Maintenance
- RFID: Radiofrequency Identifier
- RGV: Rail-Guided Vehicle (form of AMHS)
- RPT: Raw Process Throughput
- RTD: Real-Time Dispatching
- SPC: Statistical Process Control
- STC: Material Storage/Stocker and/or its corresponding controller
- WIP: Work In Progress VAO System Overview The VAO Productivity Suite is a combined set of tools capable of being executed in one or more computer systems. The VAO Productivity Suite is also referred to as the VAO system. The VAO system includes a number of components for visualizing, analyzing, and optimizing fab status and performance. A visualization component (V in VAO), allows integration and visualization of multiple fab systems and their data/status, using a graphical user interface (GUI). An analysis component (A in VAO), allows the application of advanced analytical techniques to data from multiple fab subsystems and sites, and aids in the understanding of the fab status. An optimization component (O in VAO), allows control of the fab based on the understanding of the underlying data and trends that are identified using the visualization and analysis parts.

The VAO system provides for customization and configurability by the customer, thereby accommodating differences among customers in semiconductor fab layout, product priorities, and changes in mix and focus over time. Therefore, the VAO system can be adapted to a particular set of customer infrastructure attributes. Also, the VAO system provides for tailoring of data, analysis, and optimization approaches to the specific customer business needs.

The VAO system improves fab productivity in a measurable way. The improvement in fab productivity can be measured in terms of metrics such as cycle time, factory throughput, transport efficiency (e.g., elimination/reduction of variation), inventory levels, etc. The VAO system is defined to consider total fab system performance, and through such consideration enable fab-level optimization based on measurement and analysis of fab-wide metrics.

FIG. 1A is an illustration showing an overview of the VAO system operational flow, in accordance with one embodiment of the present invention. The VAO system includes three modules, namely 1) Visualizer Module, 2) Analyzer Module, and 3) Optimizer Module. As shown in FIG. 1A, the three VAO modules can operate interactively with each other, thereby enabling continuous integrated improvement with regard to each module's area of responsibility. It should be appreciated that the VAO system is defined to integrate with existing applications and allow addition of new applications. Moreover, it should be understood that replacement of existing fab infrastructure by the VAO system is not required. The underlying architecture of the VAO system is capable of scaling as capabilities are added.

The Visualizer Module is defined to provide for collection, filtering, and presentation of fab data through a GUI, in real-time or near-real-time. The Visualizer Module collects data from various sources within the fab, integrates and filters the data to a desired form, and visually presents the data. It should be understood that the Visualizer Module does not replace existing data collection programs, but improves existing data collection capability by enabling integration and presentation of data from disparate independent sources in the fab.

In one embodiment, the Visualizer Module is defined to collect and code "rules" of the fab. These rules will include of both business rules (lot size, relative values of products, relative priority of production capacity versus cycle time, etc.) and operational rules (how tools are scheduled for PM (preventative maintenance), how problems are reported and escalated, etc.). Rules collection and coding are expected to evolve as data from the fab is analyzed and as the fab operations are optimized. It should be appreciated that the visualization of particular combinations of data may identify certain changes or opportunities for fab optimization.

The Analyzer Module builds on the data infrastructure provided in the Visualizer Module and provides additional tools and techniques to create and explore hypotheses about performance aspects of the fab in more detail. In one embodiment, the Analyzer Module is operated after the Visualizer Module is operating and configured for the particular fab environment. The Analyzer Module is defined to perform analysis on fab data as required to answer various queries. An example of a simple query may be, "Does the number of a particular error go up significantly on day shift versus night shift?" An example of a more complex query may be, "How much production capacity could be gained by changing a particular rule on queue size at this batch tool?" To facilitate the required analysis, the Analyzer Module may feed back to the Visualizer Module to identify which data should be collected and at what frequency the data should be sampled. The Analyzer Module is capable of identifying some opportunities for optimizing fab performance, but in one embodiment will only provide fab optimization recommendations. In this embodiment, the actual execution of fab control instructions is handled outside of the Analyzer Module. For example, the Analyzer Module may provide a query response that more cars are needed in the fab to satisfy required capacity, but the Analyzer Module is not responsible for directing more cars into the fab.

The Optimizer Module builds upon the Analyzer Module's capabilities and adds the ability to control or provide inputs that change the fab's existing automation systems performance (actionable control). The optimization functionality provided by the Optimizer Module enables both standard optimization approaches using predefined constraints and balances, and the capability to manipulate (modify, change, react to) significant changes in product mix, product process flow, tool count distributions, and market weightings (relative product cost changes). These changes may include intermittent (short-term price swings, for example) or long-term (ramps in production). The Visualizer, Analyzer, and Optimizer Modules can work in concert to anticipate events and take pre-emptive action, as well as to perfect past characteristic behaviors. Additionally, optimization solutions generated by the VAO suite may be used to improve the design and/or operational characteristics of various independent automation systems within the fab.

Figure 1B:
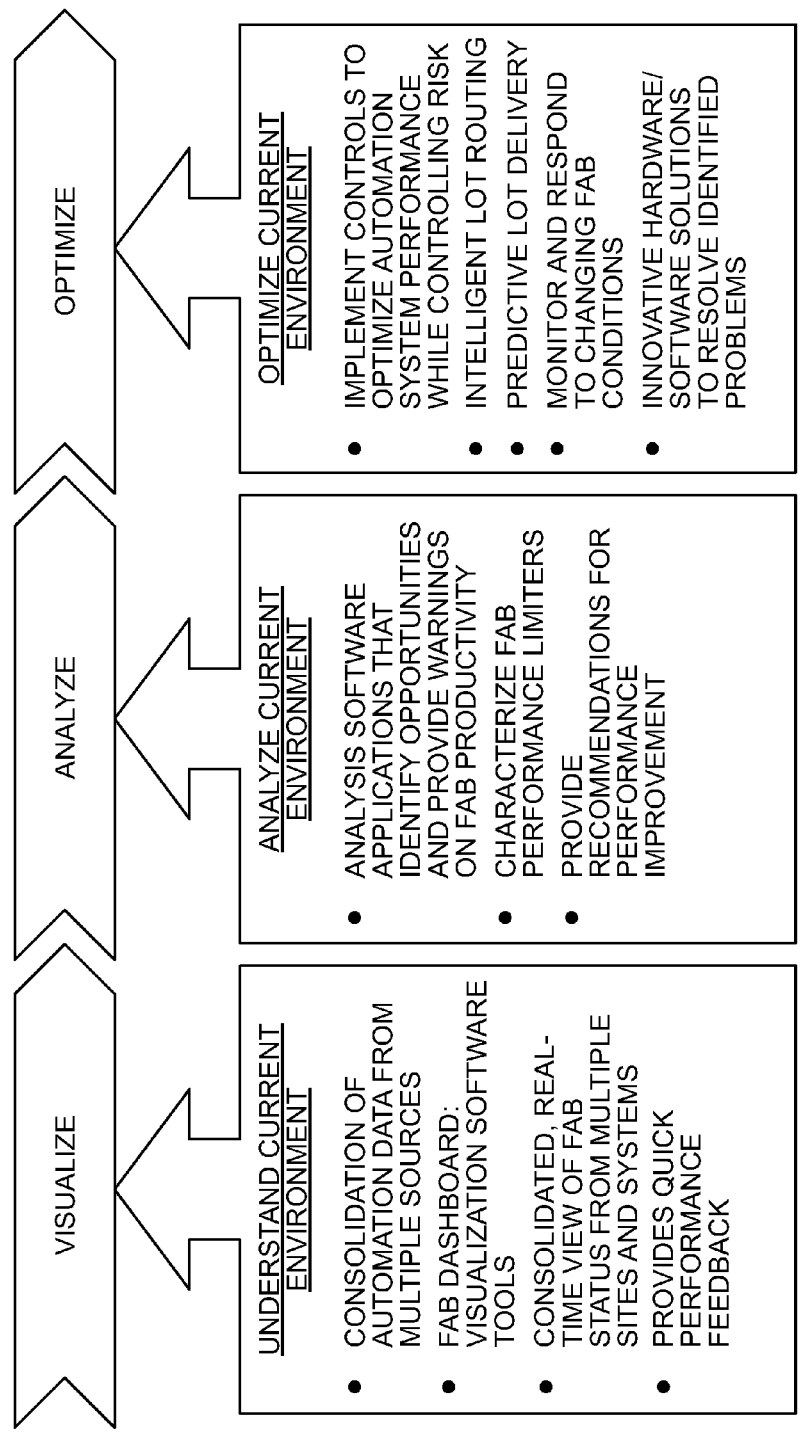
FIG. 1B is an illustration showing a phased approach to fab improvement that can be realized through implementation of the VAO system, in accordance with one embodiment of the present invention.

Also, although the Visualizer, Analyzer, and Optimizer Modules are defined to interface with each other, it should be understood that the VAO system can be deployed in either a partial manner or a full manner. For example, in one embodiment, only the Visualizer Module is deployed. In another embodiment, both the Visualizer and Analyzer Modules are deployed. In yet another embodiment, all of the Visualizer, Analyzer, and Optimizer Modules are deployed. FIG. 1B is an illustration showing a phased approach to fab improvement that can be realized through implementation of the VAO system, in accordance with one embodiment of the present invention.

VAO System Architecture

Figure 2A:
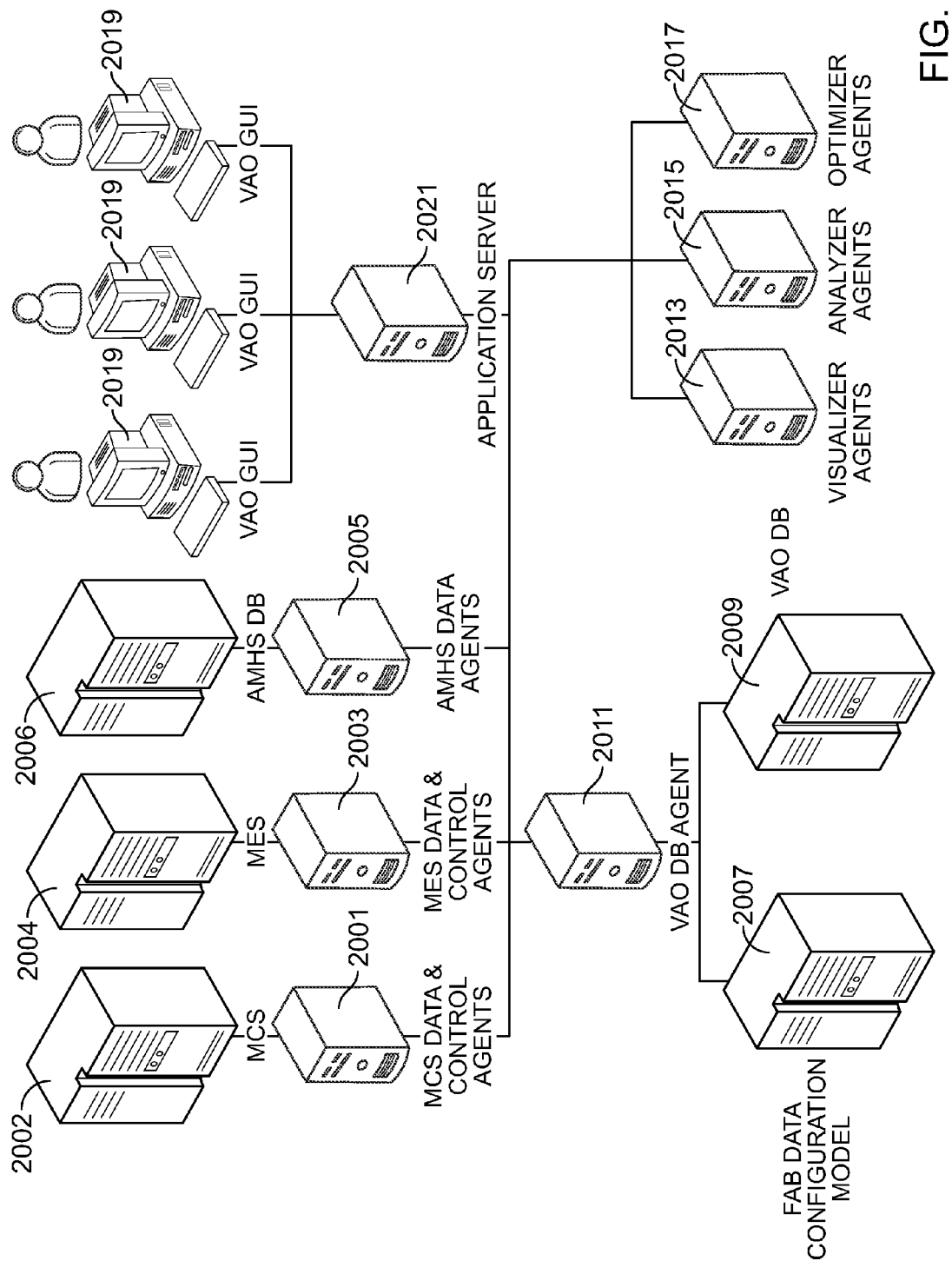
FIG. 2A shows a generalized architecture of the VAO system, in accordance with one embodiment of the present invention.

FIG. 2A shows a generalized architecture of the VAO system, in accordance with one embodiment of the present invention. The VAO system includes a number of agents defined to interface with various fab systems. For example, the VAO system includes MCS data and control agents 2001 defined to interface with the MCS 2002 of the fab, MES data and control agents 2003 defined to interface with the MES 2004 of the fab, and AMHS data agents 2005 defined to interface with the AMHS 2006 of the fab.

The VAO system also includes a fab data configuration model 2007 and a VAO database (DB) 2009, which are each accessible through a VAO DB agent 2011 of the VAO system. Additionally, the VAO system architecture of FIG. 2A shows visualizer agents 2013, analyzer agents 2015, and optimizer agents 2017, which are defined to implement the Visualizer Module, Analyzer Module, and Optimizer Module, respectively. The various VAO GUIs 2019 generated by the modules of the VAO system can be viewed at any number of client terminals in accordance with client login privileges. A server 2021 can be used to facilitate data communication between the various agents of the VAO system, the fab, and the client terminals. This data communication can be conducted over essentially any type of data communication network, including wired networks, wireless network, or a combination thereof, and can be conducted using essentially any type of mutually understood data communication protocol.

Figure 2B:
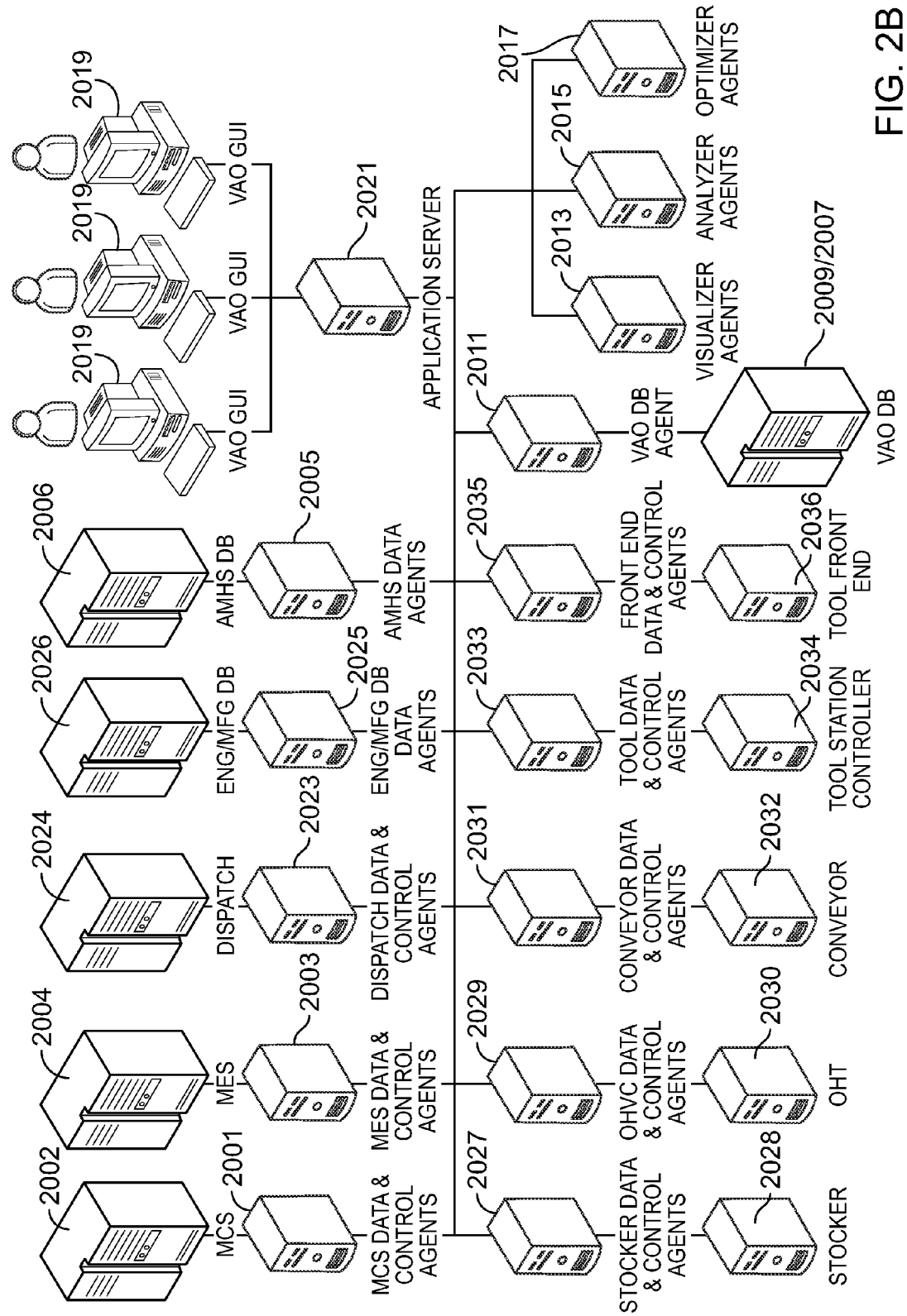
FIG. 2B is an illustration showing a deployment of the VAO system, in accordance with one embodiment of the present invention.

FIG. 2B is an illustration showing a deployment of the VAO system, in accordance with one embodiment of the present invention. The deployment of FIG. 2B is essentially an extension of the architecture described with regard to FIG. 2A. The VAO system of FIG. 2B further includes dispatch data and control agents 2023 defined to interface with a dispatch system 2024 of the fab. Also, engineering/manufacturing database data agents 2025 are defined to interface with the engineering/manufacturing database 2026 of the fab. Stocker data and control agents 2027 are defined to interface with the stocker systems 2028 of the fab. OHVC data and control agents 2029 are defined to interface with the OHT systems 2030 of the fab. Conveyer data and control agents 2031 are defined to interface with the conveyer systems 2032 of the fab. Tool data and control agents 2033 are defined to interface with the tool station controllers 2034 of the fab. Additionally, front end data and control agents 2035 are defined to interface with the tool front end 2036 of the fab.

It should be appreciated that the VAO system is designed to be customizable so as to satisfy specific customer needs. For example, the VAO system can be defined to work with many different types of messaging systems, databases, and interfaces. Also, custom data acquisition layers can be built to address customer-specific needs. These custom data acquisition layers can be defined as custom data and control agents that interface with fab systems to gather data and/or provided control data. A data acquisition layer is comprised of a data agent that is used to acquire data from an external source such as a database, or the MCS, or the MES, by way of example. The data agent is encapsulated by a control agent that is defined to take the data acquired by the data agent, process the data as necessary, and route the data to an appropriate destination. Such data acquisition layers can be defined by hardware, software, and/or firmware, or any combination thereof. Moreover, Visualizer GUIs of the VAO system are defined to be customizable by an end-user, so as to enable customization of which data is displayed and how data is displayed.

The VAO system is defined to be non-intrusive such that acquisition of data from fab data sources does not require changes to the fab data source or their control systems. The VAO system is also designed to handle fail-over with minimal impact on production. For example, the data acquisition layers of the VAO system can be defined on independent computing platforms separate from the fab resources, such that a operational disruption of the VAO system does not interfere with ongoing fab operations. Additionally, the VAO system is scalable in that modules and components of the VAO system can be distributed to operate in parallel across as many computing platforms as necessary to meet VAO system performance requirements/goals. Also, VAO system modules/components can be upgraded without disturbing other modules/components. Therefore, the VAO system can be upgraded without requiring a full VAO system shutdown. Furthermore, the VAO system can also include remote diagnostic logic to enable remote monitoring of its performance.

The VAO database is defined to store information and data associated with the fab and the VAO system as deployed throughout the fab. For example, in one embodiment, the VAO database includes fab data model information, Visualizer GUI data (including VAO GUI elements and user-generated GUI elements), parameters for calculating metrics, parameters for analytical calculations, configuration parameters, and summary historical data (such as historical data from MES, MCS, customer databases, and tools, among others). The Visualizer GUI can be customized for a given fab based on metrics used by the given fab. Fab data is collected by the various data acquisition layers of the VAO system. The collected fab data is persisted in the VAO database, and can be displayed in real-time through a Visualizer GUI. Also, customized reports can be generated from the fab data stored in the VAO database. Moreover, if a customer has its own GUI, the VAO system can integrate the customer GUI using various techniques, such as .Net, Web Services, or streamed XML, among others.

The Visualizer Agents 2013, Analyzer Agents 2015, and Optimizer Agents 2017 combine to form a VAO controller module. The VAO controller module handles complex algorithmic, statistical, and/or logic based analysis of the acquired fab data. The VAO system is defined to include a set of pre-defined algorithms, statistics, and rule-based analyses that can be applied to acquired fab data. The VAO system user can also create their own set of algorithms, statistical analyses, or rule-based analyses using the development environment provided as part of the delivery. The VAO controller module further includes a remote diagnostics capability. Also, the VAO controller module is defined to prepare acquired fab data for modeling and/or simulation.

One objective of the VAO Productivity Suite (VAO System) is to provide decision-making and control capability to the semiconductor fab to improve fab productivity and to support centralized fab control. Fab data gathered from relevant sources will be used for control decisions at any number of levels of the fab automated control system. The VAO system architecture is defined to link to customer-specific and site-specific fab infrastructure systems. In one embodiment, selection of the linked systems is enabled through a configuration system using configuration tools. Also, in one embodiment, the VAO system is equipped with web-based capability and sufficient security requirements so as to provide a centralized command and control platform for multiple fabs. As the physical size of fabs and distances within fabs increase, and as more fabs are trying to link between locations, the centralized command and control platform provided by the VAO system becomes increasingly relevant and useful.

The VAO system is defined in a sufficiently robust manner to enable fail-safe handling of off-normal and failure events, including unexpected inputs or formats, degraded modes of operation, VAO system errors, hardware failures, etc. The VAO system is also defined to provided for upgrade management with minimal downtime. Moreover, upgrades are tracked with an ability to save state, thereby enabling a reloading of a previously saved VAO system state. The VAO system can keep a record of all login activity and all user programming changes. These records can be viewed by appropriately credentialed users.

The VAO system provides password control, including hierarchical password control, such that some entities have higher viewing/control privileges than other entities. Also, the VAO system is capable of integrating with an existing customer security scheme for basic users. The VAO system can be configured to provide different levels of screen access for different classes of users. Also, a write ability can be restricted to certain classes of users and to certain screens. Additionally, the VAO system can be configured to correlate rule change and/or screen change privileges to certain classes of users.

The VAO system can be temporally synchronized with the fab, so as to enable synchronization with various clocks associated with various data sources in the fab. Also, the VAO system can be temporally interfaced with an external time clock. The VAO system can also be defined to link data across multiple fab sites.

The VAO system is defined to be hardware agnostic. In other words, the VAO Productivity Suite is defined to operate on essentially any type of hardware, such as servers, network appliances, and client systems. Additionally, the VAO system may include online manuals and online help resources.

The VAO system is defined to interface with customer's existing MES interfaces, such as SiView, FactoryWorks, Fab300, Promis, WorkStream, Miracom, CAMSTAR, among others. The VAO system is defined to interface with customer's existing RTD interfaces. The VAO system is defined to interface with customer's existing MCS interfaces, such as Asyst, Murata, Daifuku, among others. The VAO system can be EDA-compliant to enable station control. The VAO system can be defined to provide equipment data interfaces for a number of equipment types within the fab. The VAO system can be defined to provide facility and web backbone interfaces. Additionally, the visualizer agents, analyzer agents, and optimizer agents of the VAO system are defined to be extendable. Therefore, the customer, i.e., fab, can develop customized extensions to the VAO system agents as required for fab-specific applications.

Visualizer Module Features

The Visualizer Module provides an integrated view of the overall performance of the fab. The Visualizer Module shows both the status of the AMHS system (including a view of cars moving through the factory) and the status of the tools within the fab. The Visualizer Module provides a number of dashboards (in GUI form) for monitoring fab performance metrics as well as for providing a view of the operating fab.

The Visualizer Module conducts collection, filtering, and presentation of factory data to managers and systems. The purpose of the Visualizer Module is not to replace data collection programs, but to improve them by allowing presentation and integration of data from disparate sources. The Visualizer Module provides for collection and coding of "rules" of the fab. These rules include both business rules (lot size, relative values of products, relative priority of production capacity versus cycle time, etc.) and operational rules (how tools are scheduled for PM, how problems are reported and escalated, etc.) Rules gathering will evolve as the system progresses through analysis to optimization and as the data from the fab is analyzed. The mere act of visualizing the right combinations of data may identify certain beneficial changes. The fab can make changes in order to achieve improved performance based on the Visualizer Module output.

The Visualizer Module is defined to provide fast, i.e., real-time or near real-time, quality control and fab visualization. For example, screen refreshes for the various GUIs provided by the Visualizer Module can be provided a frequency greater than one screen refresh per one-half second. The Visualizer Module is also defined to provide for rapid transition between display of various languages, e.g., English, Japanese, Chinese, Korean, German, etc., to facilitate consulting, support, programming, and debugging. Transition between various languages can be enabled by one or more GUI buttons. In various modes of operation, the Visualizer Module may provide still pictures and video feeds from select areas of the fab. Also, the Visualizer Module may provide a control interface to various cameras in the fab.

The Visualizer Module is defined to provide many GUI dashboard views of various aspects of the fab and associated data. The GUIs generated by the Visualizer Module provide an interface for navigation and commands. The Visualizer Module is capable of interfacing with special sensor-laden travelers, such FOUPs on systems, alignment boxes, roaming facilities, etc. The Visualizer Module is defined to provide a GUI dashboard view of AMHS and tool status changes as they occur in fab. The Visualizer Module is defined to provide GUI dashboard views of current and historical fab statistics presented in various forms such as charts, graphs, tables, maps, etc.

The Visualizer Module is capable of handling large data sets in performing correlations, trends, and sorts. For example, data sets including several hundred thousand rows may be processed. The Visualizer Module is defined to enable exporting of reports, graphs, data, and other information, to various systems outside of the VAO system. The Visualizer Module can be controlled to filter and flag clearly bad data. Data filtering can be performed using specific algorithms. Also, questionable data can be flagged for human check and filtering. The Visualizer Module can include a GUI-based mechanism to capture human input regarding problems, observations, comment, etc., to facilitate discussion and problem resolution. The aforementioned human input may be categorized and sorted by tool, date, problem, and essentially any other relevant indices.

The Visualizer Module is defined to enable GUI-based definition of shared resources, such as FOUPs, vehicles, probe cards, etc. The Visualizer Module is defined to provided a GUI-based mechanism for defining/capturing rules to be applied to various data types acquired from the fab. The Visualizer Module is defined to handle multiple customer sites and structures by enabling GUI-based definition of multiple (overlapping) hierarchies on fab elements, such as fab site, building, phase, floor, bay, tool, operation, flow, product, module, route, etc. The Visualizer Module is capable of exporting and importing various input and output structures through an interface to fab modeling and simulation tools.

Fab Data Modeling

While fabs will have common elements, each fab will have structural and operational differences. In order to construct the hierarchies, relationships, and configuration of each fab, the Visualizer Module of the VAO system provides a tool/module for creating a fab logic model. The fab logic model identifies the physical systems and attributes that will be monitored and controlled by the VAO system. The fab logic model is to be provided for use by applications and industrial engineers to build integrated views of the fab. Also, in the Visualizer Module user interface, the icons for tools and their subcomponents are displayed based on information in the fab logic model, i.e., fab data configuration model. This allows VAO system to provide in depth status and statistics updates at the tool subcomponent level.

Rules Engine

A rules engine, as provided in the VAO system, is a tool or application that allows logical comparisons that can be used for descriptions, decisions, and analysis. The rules engine is defined to perform user-specified algebraic manipulation of relationships without requiring provision of explicit software programming code by the user. Therefore, "rules" can be designed and implemented by users such as application engineers, product engineers, or automation engineers. It should be appreciated that the architectural design and human interface features of the VAO system enable efficient and productive use by non-software engineers.

It is expected that rules will be created to specifically detail customers' requirements. Rules created by and for customers are referred to as "Red Rules." Rules internal to the VAO system that specifically detail behaviors and controls are referred to as "Blue Rules." The VAO system is capable of separating and protecting the Red Rules and the Blue Rules from each other. VAO system supplier intellectual property (IP) may be built into the Blue Rules, and the Blue Rules may be replicated from factory-to-factory. Customer Red Rules may involve customer proprietary information and IP that may need to be protected. A number of details obtained from the configuration tool or fab logic model may form a subset of the Red Rules. Therefore, any method for flagging or automatically generating rules as part of the fab modeling process, i.e., as part of developing the fab logic model, can be used to reduce the amount of effort required to create the Red Rules.

Monitoring of Transport-Dependent Cycle Time

This feature of the Visualizer Module provides for collection of metrics on the transport-layer-dependent portion of transport cycle time for lots. Information on transport times is acquired from the MCS and lower-level transport controllers. Information on tools, lots and carriers (for example, to distinguish automated dispatches of product lots from manual or automated dispatches of monitor or test lots) is acquired from the MES. The Visualizer Module can use current and historical data to establish baselines and trends, and then use current data to track progress on cycle time improvements.

Fab Video Camera Agents

Fab video camera agents provide for both real-time user-selected monitoring as well as selected event-driven triggers of recording for later playback (see, for example, the Traffic Congestion Monitor). Applications that can be enhanced by way of the fab video camera agents include tracking of traffic jams, tracking of stopped cars, and tracking of other error conditions in the fab (depending on the number and location of cameras). The fab video camera agents include a camera control and link agent, a camera GUI screen template agent, and the agents and rules governing event-driven "triggering" of recording.

Traffic Congestion Recording and Playback Modules

This Visualizer Module component enables selected regions of the fab to record and later playback traffic flow for limited periods of time. "Triggering" of the recording can be done manually, on a scheduled basis, or based on an "event" trigger from an analysis monitor (see, for example, the Transport Traffic Congestion Monitoring Module, or the Transport Traffic State Analysis function), or from a tool event (for example, the restart of a furnace, stocker or other high-demand element after an extended down period).

A recording agent portion provides for recording (compressed) of transport information about payloads within, entering, or exiting a (pre-selected) region of the fab over a period of time, which might be manually set, pre-scheduled, or triggered by an external event and/or agent. Data can be stored for later analysis. Also, rules can be established to set limits on total memory, time, or number of recordings within a given period of time.

A playback agent portion enables a user of sufficient security privilege to "replay" the traffic recording on a client system. Controls are provided to allow the playback to be at normal, slow, or fast speeds. Through the use of the playback agent, the user can look for trends to help discover root causes of the congestion, or for additional ideas for "triggers" for recording or reports.

OHV Position Interpolation Method

OHV position and status data acquisition frequency, as obtained through the AMHS monitor, may not be sufficient to directly render OHV position/movement on the GUI screen. For example, a fab operator may not be able to follow the position of a single OHV on the GUI screen because the OHV can travel beyond the scope of the fab area displayed in the GUI screen between OHV position and status data acquisition points. A solution for rendering of the OHV position/movement on the GUI screen based on the available OHV position and status data acquisition frequency is described below. It should be understood that while the description herein is provided in the context of OHV position, the same position interpolation method can be applied to other route-constrained transport devices, such as conveyers, rail-guided vehicles (RGV), and automated guided vehicles (AGV), among others.

Overhead transport systems are used to move material undergoing the manufacturing process (work in progress or WIP) between automated processing equipment and storage locations in semiconductor fabrication plants ("fabs") Plant operators have an interest in maximizing the efficiency of material flow to reduce manufacturing cycle time and to keep expensive processing equipment fully utilized. Since material flow is greatly affected by factors like transport vehicle availability and traffic management, it is useful to be able to visually monitor the progress and status of transport cars as they move throughout the factory.

Overhead vehicles (OHV's) maintain communication with a dispatcher controller (overhead vehicle controller, OHVC) and periodically report position as they traverse a network of rails. The railway system is subdivided into sections called routes. The car accumulates a count of its distance as it travels; but there are placards with barcodes placed adjacent to the rail at key locations. These locations include entry to a route, exit from a route, drop-off/pick-up points, transition between OHVC domains, and locations where a change in motion profile is required. The car carries a barcode reader that is capable of reading the barcode placards as it passes and initiating action when a placard is detected. Passing a barcode placard generates an event and causes the car to initiate the appropriate action. Encountering the entrance to a route causes the distance measured since the start of the route to be zeroed.

Each OHVC has a supervisory domain including routes and a collection of cars that it is monitoring as each car traverses the route domain. Cars exiting the domain are passed off to the OHVC for the adjacent route domain. OHVC's in an area aggregate status and vehicle information under a master OHVC (MOHVC), which implements a SEMI E-82 interface to a Host system. In most cases, this Host system is the fab's Material Control System (MCS), which manages material transportation and storage subsystems for the fab's Manufacturing Execution System (MES).

A subsystem called AMHS Monitor is provided to facilitate OHV status and position collection. The AMHS Monitor employs a series of data collection agents to poll MOHVC, material storage/stocker (STC), lifter/elevator (LFC) and MCS controllers and stores the resulting status in a central database. The VAO system collects vehicle position periodically from this database and uses it to display car position. In one embodiment, the AMHS Monitor may not provide OHV position and status frequently enough. For example, the AMHS Monitor may only provided OHV position and status once every 5 seconds. In this embodiment, fab operators may not be able to follow the position of a single car on the screen because the car can travel beyond the scope of the screen within the duration of a single update. The OHV position interpolation method disclosed herein bridges the gap between OHV position and status sampling instances. It should be understood that while the description provided herein is in the context of OHV position, the same position interpolation method can be applied to other route-constrained transport devices, such as conveyers, rail-guided vehicles (RGV), and automated guided vehicles (AGV), among others.

Figure 3A:
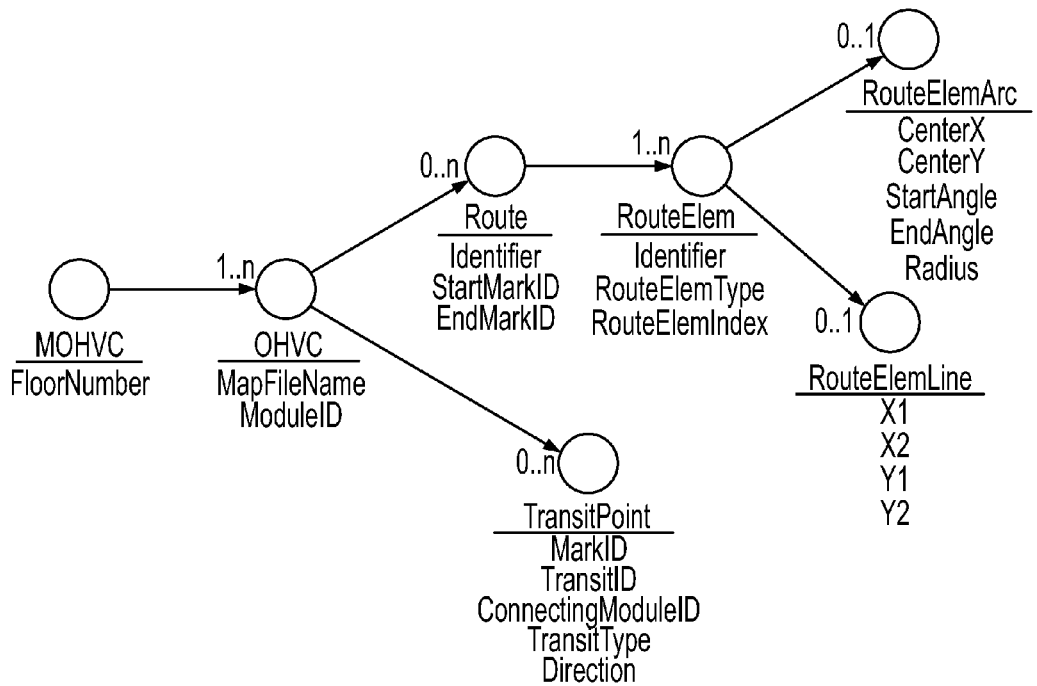
FIG. 3A shows an example construction of a set of objects for a given OHVC map file, in accordance with one embodiment of the present invention.

Each OHVC has one map file. The map file for each OHVC is read to construct a corresponding set of objects. FIG. 3A shows an example construction of a set of objects for a given OHVC map file, in accordance with one embodiment of the present invention. The map files for various OHVC are then joined as follows. For each OHVC, find each unconnected adjacent OHVC by matching a Transit Point Connecting-ModuleID to another OHVC ModuleID. Using each of the pair of TransitPoint MarkID's to find either the starting or ending coordinate of the Route (StartMarkID, EndMarkID), compute the position offset between the points. Since these points should be coincident, subtract the offset from each Cartesian coordinate in the adjacent module to correct.

Figure 3B:
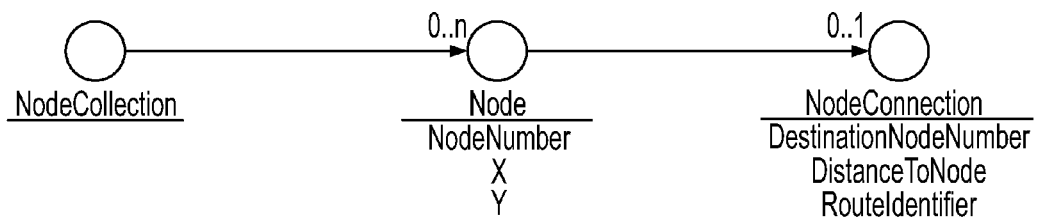
FIG. 3B shows an example set of interconnected nodes, in accordance with one embodiment of the present invention.
Figure 3D:
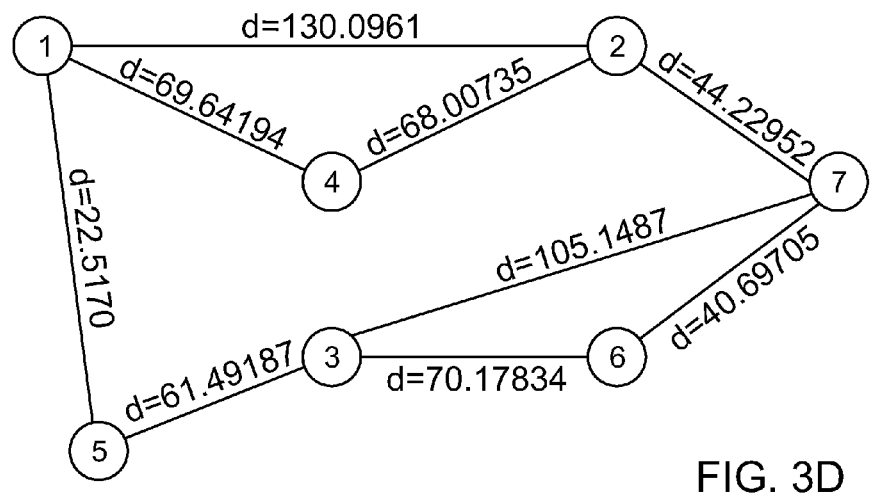
FIG. 3D shows an example output of the Dijkstra algorithm as applied to process a second of interconnected nodes, in accordance with one embodiment of the present invention.

A set of interconnected nodes is then created as follows. For each route, find the start and end points, and create a Node object for each unique end point. Create a NodeConnection object for each route that can transition between nodes. Routes are directional, so only include transitions from Start-Point to EndPoint. FIG. 3B shows an example set of interconnected nodes, in accordance with one embodiment of the present invention. The set of interconnected nodes represents input to the Edsger Dijkstra's algorithm for computing the shortest path between two points. FIG. 3C shows an expression of the Dijkstra algorithm, in accordance with one embodiment of the present invention. FIG. 3D shows an example output of the Dijkstra algorithm as applied to process a second of interconnected nodes, in accordance with one embodiment of the present invention. Point #5 in FIG. 3D is not a true node because there is no alternative course (i.e., the number of nodes can be reduced by joining the segments together). In the case of an OHV traveling from route to route, this case is frequent. When finding the shortest path, a check is made for the case of no alternative routes first to improve performance.

Figure 3E:
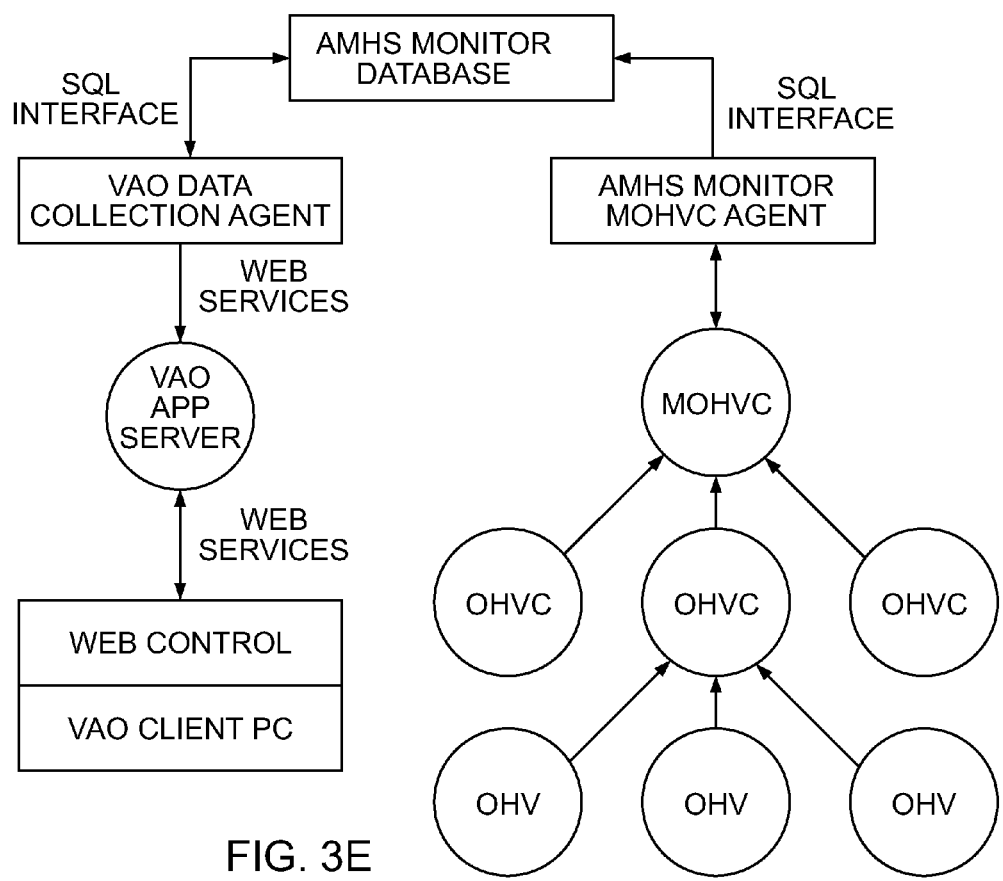
FIG. 3E shows a data flow within the VAO system to implement the OHV position interpolation method, in accordance with one embodiment of the present invention.

FIG. 3E shows a data flow within the VAO system to implement the OHV position interpolation method, in accordance with one embodiment of the present invention. At runtime, a VAO data collection agent polls the AMHS Monitor database periodically for new OHVC positions. Data samples are stored in the VAO App Server with the following information:
Fab element ID of the OHV car,
Fab element ID of the current area where the car is located,
Fab element ID of the floor where the car is located,
Fab element ID of the route where the car is located (which has links to the line and arc route elements),
Position of the vehicle relative to the start of the route,
Date/time stamp when the data was updated, and
An array of date/time and status values that indicate past car status changes, wherein status values include: Starting up, Initializing, Initial Waiting, Registration, BC Test, Waiting in Stopping, Circulating (Wait Running), Running to Pickup Location, Running to Drop-off Location, Loading from Pickup Location, Unloading to Drop-off Location, From (Pickup) Wait, To (Drop-off) Wait, Origin Interlock, Error.

Figure 3F:
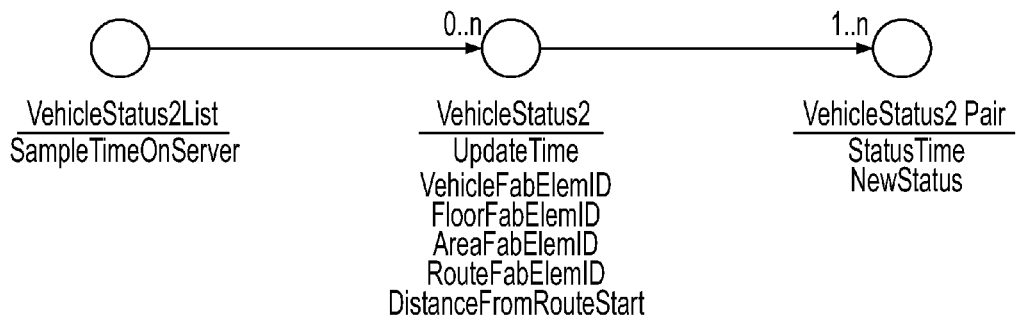
FIG. 3F shows an example of a data structure reporting updated vehicle positions, in accordance with one embodiment of the present invention.
Figure 3G:
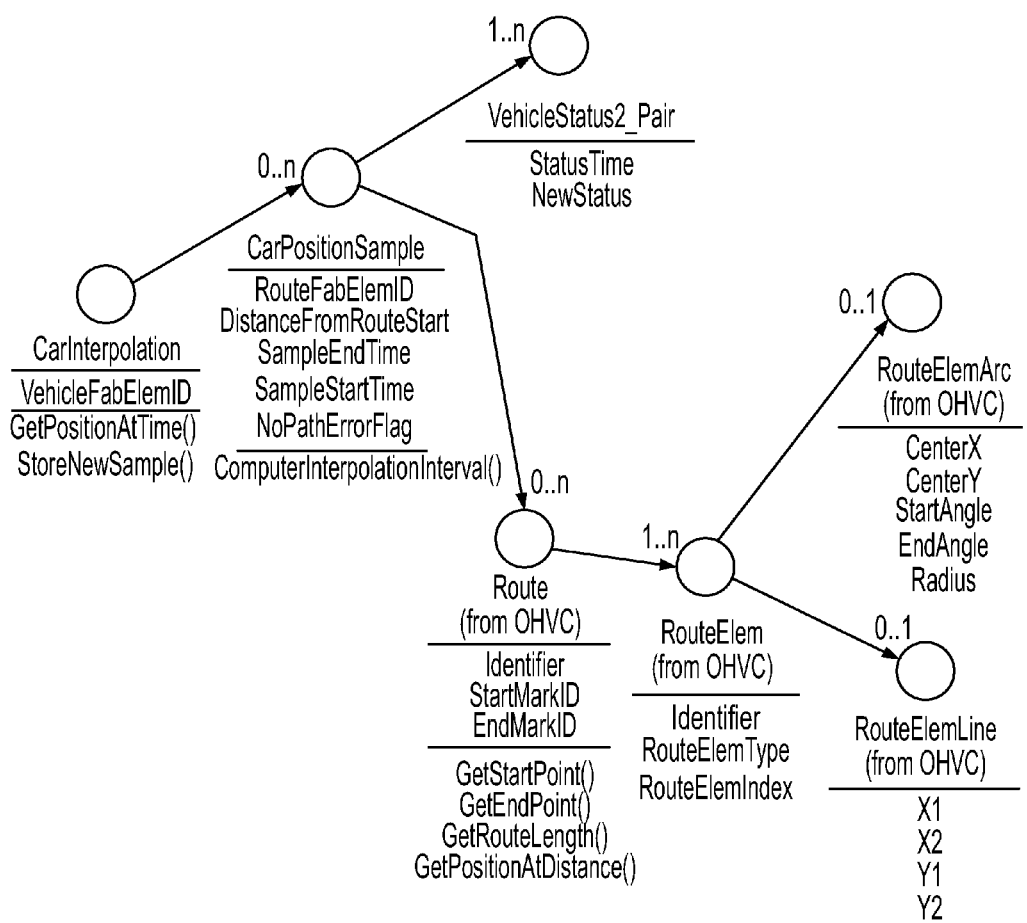
FIG. 3G shows an example data structure including the list of routes for the vehicle to traverse, in accordance with one embodiment of the present invention.

OHV position and status is then buffered in the client. The client polls web services periodically for new samples, retrieving a list of any changes. Any updated vehicle positions are reported back in a data structure. FIG. 3F shows an example of a data structure reporting updated vehicle positions, in accordance with one embodiment of the present invention. The client then populates the vehicle position into a data structure, including the list of routes for the vehicle to traverse. FIG. 3G shows an example data structure including the list of routes for the vehicle to traverse, in accordance with one embodiment of the present invention.

There is one CarInterpolation instance per vehicle. If CarInterpolation's list of CarPositionSample objects is empty, then a new sample is simply stored given the route position and distance. If CarInterpolation's list of CarPositionSample objects is not empty, an attempt is made to find the path from the last sample's position to the new sample position. The node network contains hundreds of nodes, so it's not practical to rebuild it for every shortest path calculation. Instead, the same network is simply modified with temporary nodes representing the last car position and the current car position. Unidirectionality is not strictly necessary, but it makes the problem fit a generalized Dijkstra implementation more neatly. The algorithm may be modified by adding some steps (cases) to handle bidirectional route segments (such as might be encountered in certain conveyer or RGV implementations).

Figure 3H:
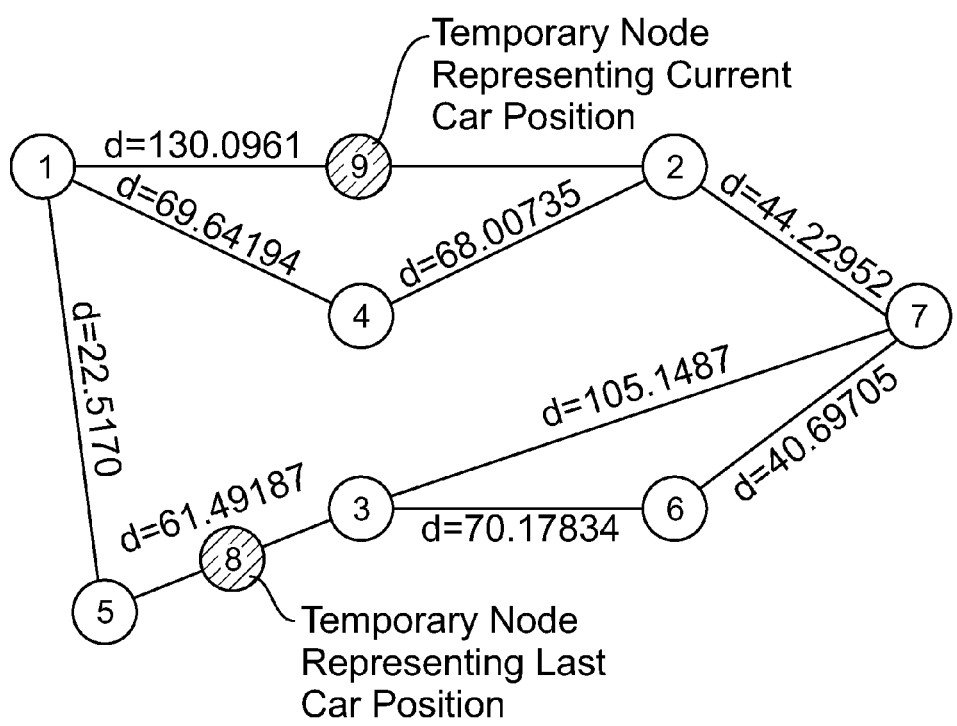
FIG. 3H shows as example network modification with temporary nodes, in accordance with one embodiment of the present invention.

FIG. 3H shows as example network modification with temporary nodes, in accordance with one embodiment of the present invention. As shown in FIG. 3H, assuming that the track direction is configured as (3)(5)(1)(2), there isn't a choice of direction, thus (8)(5)(1)(9) is implied. Since there is no branch point from start to end, Dijkstra would not be used. The results from previous Dijkstra calculations are stored and used in preference where possible. Supposing that the test above failed (i.e. there was a branch point between (8) and (9) in FIG. 3H), a check would be made for a previous calculation from (5) to (1). This is possible because we know all routes are unidirectional. Therefore, it's possible to back up by one route from the end position and advance by one route from the start position to get a candidate start and end.

A timer fires to update displayed car positions on the screen. In one embodiment, the timer fires every 500 milliseconds. The timer event handler subtracts an arbitrary amount of time (15 seconds, for example) from current time and then calculates the current position based on the time. This can be done by iterating through the array of CarPositionSample values and finding consecutive objects where the target time is between the sample times. Then, the current offset in the second route list is calculated by multiplying the total route distance by the fraction of the elapsed time.

For example, sample #1 is at 12:00:00, sample #2 is at 12:00:05 and sample #3 is at 12:00:10. The total distance in the route path for sample #3 is 6 meters. The client's display time is 12:00:05.2, so only 200 milliseconds or 4% of the total time for sample #3 has passed and the distance traveled is set at 24 cm. The Cartesian coordinate can be calculated using the line or arc formula for the segment 24 cm along the computed route path. Because the car display is offset in time, so is the car status. The car status determines the color of the graphic so it's important to match historical status with the position. The correct status can be found by searching the VehicleStatus2_Pair array for the position sample.

Analyzer Module Features

The Analyzer module builds on the data infrastructure provided in the Visualization Module and provides additional tools and techniques to create and explore hypotheses of performance aspects of the fab in more detail. The Analyzer module includes both basic analyses, such as E84 error Paretos by day, shift, bay, tool, maintenance, etc., as well as more complex analyses such as capacity versus queue size and tool qualification, etc. The analysis results generated by the Analyzer module may indicate potential change requirements to the visualizer phase (for example, changes in which data to collect and at what frequency). The Analyzer module is capable of identifying opportunities for optimizing performance and providing associated fab adjustment recommendations. Actual implementation of the recommended fab adjustments can be done manually, or can be orchestrated through the Optimization Module.

The Analyzer module is defined to identify data patterns relevant to fab problems and/or fab performance deficiencies, and facilitate determination of corresponding root causes. While analysis may include creation of new dashboard views (GUIs) and data metrics, it should be understood that the analysis capability afforded by the Analyzer Module includes provision of tools and techniques to create and explore hypotheses about performance for testing. The Analyzer Module is defined with the expectation that understanding the variation and underlying distributions of fab variables may be as important as understanding the mean values and trends of the fab variables. Further, the importance of understanding the variation and underlying distributions of fab variables is likely to increase as fab performance improves and as the remaining causes of fab inefficiency change from "error correction" to "operational rule improvement."

The Analyzer Module of the VAO system provides a number of different types of analytical techniques, including but not limited to:
  Comparative Analyses: differences between "good" and "bad" time periods, wherein the time period can be variably set,
  Basic Value Analyses: traffic jams, WIP bursts,
  Opportunistic Searches: exploratory analyses, perhaps "canned" as time goes on,
  Simulation and "What If" Analyses, and
  Rule-Change Analyses.

A number of Analyzer Module features are described hereafter. The Analyzer Module is defined to enable logical data comparisons that can be used for decision making and analysis. The Analyzer Module is also defined to provide GUI-based creation and evaluation of algebraic relationships among data. For example, a GUI is defined to enable a user to enter, edit, and manipulate rules algebra, including specifications of tradeoff value functions and data weighting parameters. Also, the user can create and save reusable functions. The saved functions can be accessed by the user through a drop down menu in a GUI provided by the Analyzer Module.

Rules can also be developed to include links to applications outside of the VAO Productivity Suite. The Analyzer Module is capable of maintaining separate sets of rules to enable access control thereto by various entities according to issued privileges. Also, the ability to read, delete, and/or edit rules can be dependent on class of login and/or specific rule security settings. The Analyzer Module is defined to track/log rules changes, and enable rollback to a previously saved rule state. The Analyzer Module can be defined to generate some rules based on linkage to inputs to the fab logic model. The Analyzer Module is capable of organizing and segregating rules according to fab site. For example, as multiple fab sites are connected to the VAO system, there may be slightly different versions of rules for one site versus another. Rules for use in the Analyzer Module can be developed and tested, and then released for use by the customer.

The Analyzer Module provides for extraction of new variables from existing data sets by applying filters, sorts, and functional combinations, including statistical functions. The Analyzer Module can be defined to provide for a replay of data on a time axis. The speed of playback is user-adjustable. The Analyzer Module can be defined to perform frequency-space analysis, i.e., Fourier analysis, on a given data set. The Analyzer Module can be defined to calculate financial metrics such a return-on-investment (ROI), activity-based-costing (ABC), etc. The Analyzer Module can be defined to execute standardized fab performance and diagnosis applications, so as to allow "fingerprinting" or "baselining" of fabs. The fingerprinting/baselining can be used to guide subsequent detailed analyses and to measure performance improvements, i.e., before and after performance improvement.

The Analyzer Module can be defined to analyze traffic jams/congestion within the fab. For example, analyses can be performed on a time scale, wherein a density of a given entity (e.g., FOUPs, wafers, cars) within a selected area of the fab (e.g., tool, route, intersection, bay, floor, etc.) is measured and recorded. The traffic jam/congestion analysis can track time histories, monitor metrics, and issue warnings in accordance with the fab logic model and rules engine. Also, the results of the traffic jam/congestion analysis, including warnings, can be conveyed to the Visualization Module for rendering in currently displayed contexts. Also, the results of the traffic jam/congestion analysis can be conveyed to the Optimization Module to enable correction or preventative action within the fab.

The Analyzer Module can be defined to identify and evaluate bottlenecks and bursts in the fab. The bottleneck/burst analysis can be related to tools, transport, queuing, and/or process flows. The bottleneck/burst analysis can be performed on user-defined or pre-set time scales to enable calculation and comparison of averages and variations. The Analyzer Module can be defined to monitor transport-dependent lot cycle time, as a metric for tracking analysis improvements. The Analyzer Module can be defined to evaluate load balances in the fab. For example, the load balance analysis can compare transport loads of various lifts, cars, stockers, routes, etc., on an average basis and in terms of variations and time scales. The Analyzer Module can be defined to evaluate and convey operational "states" of the fab based on functional analysis of variables. Definitions of states can be functions of hierarchical, blue, and red rules. Some exemplary states may be chaotic fab, overloaded fab, or normal fab. The fab state analysis can also identify phase changes to track when/how the fab moves from one state to another. The Analyzer Module can be defined to operate various learning systems to identify patterns and suggest modifications for improvement.

The Analyzer Module can be defined to export analysis results, including data and context information, to external programs to allow for human-guided searches of data and comparisons. The Analyzer Module is defined to provide a number of GUIs for conveying data and analysis results in various forms, such as Pareto plots, contour plots, 3-D plots, and color plots. Also, "heat map" plots can be generated to store fab state fingerprints. The Analyzer Module can be defined to provide a wizard for creating new graphs from data accessible through the Visualizer Module. The Analyzer Module provides GUI-based dashboards for viewing fab conditions, such as traffic jams and bottleneck bays. Historical fab conditions can also be played back. The Analyzer Module provides a GUI-based dashboard for WIP calculations.

In one embodiment, the Analyzer Module includes an "Opportunistic Identifier," which provides a semiautomatic search (BKM comparisons) coupled with a powerful human-interface analysis engine for handling large sets and defining persistent new variables for visualization. The Analyzer Module can also be defined to provide fab simulation capability. Such a simulation capability would allow prediction of future fab data based on observed fab data, and would allow performance of searches, analyses, and calculations on both observed fab data and predicted fab data to support decision making. Also, the fab simulation capability can include "what if" analyses on inputs and/or subsets of rules.

Traffic Congestion Monitoring Module

The traffic congestion monitoring module provides recording and reporting capability for traffic congestion events in the fab. The traffic congestion monitoring module can analyze and report on vehicle density within a section of track or region of the fab. Additionally, the traffic congestion monitoring module can be defined to consider the effect of local tools on congestion in the fab. For example, the traffic congestion monitoring module can evaluate whether congestion events tend to happen when a high-throughput tool returns online after maintenance or after a down event.

In addition to observing congestion events as they happen in the fab, the traffic congestion monitoring module can be defined to identify early precursors/correlations to congestion events, such as an impending traffic jam. As root causes and/or early precursors/correlations are learned, the traffic congestion monitoring module agent can send notifications (warnings, alarms) to other agents. These notifications could trigger recording, or later could be used by the automation control elements (possibly by way of the Optimization Module) to mitigate the impending congestion event.

Traffic State Analysis Module

The traffic state analysis module can perform analyses to calculate Quality of Service (QoS) metrics characterizing congestion in the fab, or a specific area of the fab. These QoS metrics can be used as triggers to direct the traffic congestion monitoring module to start recording traffic jams, or to direct an Optimizer Module to take preemptive action to avoid an adverse traffic condition in the fab. The traffic state analysis module can also be defined to perform analyses for determining transport phase changes in the fab.

While the traffic congestion monitoring module focuses on identifying the formation of severe congestion and reaction to things such as E84 error rate increase, the traffic state analysis module operates to identify more inherent issues and propose changes in behavior (rules) of the fab to improve the congestion situation. For example, as the traffic density of a region increases near a critical "jamming" level, the traffic state analysis module can operate to send an event to an Optimizer Module, so that transport to and through the affected region might be limited only to higher priority jobs, with other jobs being either re-routed or delayed (depending on priority or destination state).

E84 Event Monitoring Agent

The E84 event monitoring agent is defined to acquire and combine information from the MCS and OHVC, from the Active side, and from the MES (tool controller) from the Passive side. Thus, information about warnings and timing from the Active side, and about tool state, loadport (E87) state, and carrier ID from the Passive side can be combined to provide high-level analysis of trends of E84-related problem events, such as:

Pareto of events by type (Tool-induced, Not Ready, Hardware, Unknown, etc.) especially for those events where the Active and Passive logs disagree on the event (or sequence of events), Pareto by Delivery vehicle, Pareto by Carrier Type (FOUP vs. FOSB, FOUP brand/model, FOUP ID), Pareto by destination (by Tool Group, by Tool, by Loadport), and Pareto by Time-Of-Day.

The information acquired and generated by the E84 event monitoring agent can be used to track progress in E84-event reduction, and to identify key regions/tools for detailed analysis and correction activities.

Advanced E84 Diagnostics Modules

The advanced E84 diagnostics modules provides a more intense combination of software, hardware, and service activities to be applied to the more persistently troublesome fab regions and/or tools identified by the E84 event monitoring agent, to reduce the error rate and to aid in E84-related root cause analysis. In one embodiment, the advanced E84 diagnostic modules include a combination of diagnostic hardware modules for direct E84 parallel I/O monitoring, and/or a combination of Scout hardware connections and FDIM tool-monitoring to capture true states of E87 carrier and loadport state machines, of presence and placement sensors during handoffs, and of RFID (carrier ID) data. Based on results, the advanced E84 diagnostics modules can suggest specific software or hardware tests that may result in requests for changes to tool software behavior, or changes in operational procedures for switching between manually loaded and automatically loaded modes of the tools in question.

RPT Analysis Module

The RPT analysis module is defined to perform detailed internal tool throughput analysis and reporting using FDIM links to tool events. The RPT analysis module can be modified for specific selected tools (and recipes) to gather detailed tool-level information to optimize tool (and fab) productivity. The FDIM tool connectivity software can be used to connect to the tool and tool controller to gather the specific detailed timing information. Depending on the specific tool and specific detail of timing required, limited physical (hardware) detection or sensor connections may be needed from the fab. An RPT connection agent can be provided to gather the detailed information from the tool. The RPT connection agent can also be defined to acquire additional information from MES links (to identify tool state as online or in maintenance, for example). An RPT GUI agent provides the ability to study details of a specific run, or generate reports comparing multiple runs (and as the program advances, multiple tools).

Operational Bottleneck and WIP Balance Tracking Agents

The operational bottleneck and WIP balance tracking agents are defined to perform calculation of queue sizes by operation, tool group, tool, including analyses of "bubbles/bursts" and "queue reserve" or starvation protection against upstream events. The operational bottleneck and WIP balance tracking agents are defined to combine transport, tool, and MES data in selected operational areas and tool groups to understand line balance and demands of "burst capacity" on tools, storage, buffering, and transport systems.

Operational queue size information can be gathered from MES (logical location of lots) and from tool information (to properly handle lots in internal buffers of tools like vertical furnaces). The queue sizes (measured in terms of carriers, of wafers, and of expected process time) can then be analyzed by operation (process step), by tool group, by bay (physical proximity). More advanced analyses can provide metrics that are weighted by criticality (that is, by the risk factor of starvation for the more critical tools), and by "Distance" from the tool (metrics accounting for the time-separation and distance-separation of non-loadport-queued lots from tools). These measurements can be used to develop metrics of "Queue Reserve" (insurance from down events) by tool group and operation. Queue may be calculated in terms of wafers, carriers, jobs, hours, or a risk factor such as "probabilistic time" that could include likelihood of stochastic events (such as tool breakage, process slowdown, human interference, etc.) and the matching recovery times. In other words, the unit of "reserve" may be "risk reserve," not merely WIP quantity.

Another analysis performed by the operational bottleneck and WIP balance tracking agents is directed to "Burst" predictions (imbalances in WIP level caused by extended downtimes of high-throughput tools or by skewed dispatching) for downstream tools and transport systems. Initially these might provide indications for changes in storage or transport needs in specific fab areas in the hours to come. These indications can be used as inputs to Optimizer Module elements for taking corrective action to balance and to control variation in the fab.

Optimizer Module Features

The Optimizer Module is defined to provide optimization outputs and controls (near-time or real-time) based on advanced calculations and/or models of the fab. Thus, the Optimizer Module is defined to actually control fab operations to improve fab performance based on knowledge gleaned from the Analyzer Module and/or from independent optimization techniques. The optimization techniques implemented by the Optimizer Module are adaptable and can handle significantly different problem sets without re-programming and without substantial re-writing of rules. In one embodiment, the Optimizer Module includes "learning" systems that propose changes in fab system behavior based on "system-level" monitoring (for example, identifying "phase shifts" in the fab based on new, emergent behaviors).

In addition to using standard optimization approaches of predefined constraints and balances, the Optimizer Module is also capable of manipulating (modifying, changing, reacting to) fab controls in response to significant changes in product mix, product process flow, tool count distributions, and market weightings (relative product cost changes). These changes may include intermittent changes (short-term capacity price swings, for example) or long-term changes (ramps in production). Additionally, the Optimizer Module is capable of anticipating events.

The Optimizer Module is defined to optimize the factory as it exists. Therefore, the Optimizer Module is capable of controlling a number of values in the fab to achieve some maximum value function. Also, in one embodiment, optimization control can be manually validated or tested offline before enabling full automatic fab optimization control by the Optimizer Module. Therefore, the Optimization Module can be set to operate in either a suggestion mode or in an action mode.

The Optimizer Module is defined to send direct commands to specific subsystems in the fab. The commands can be directed to various purposes, such as changing priorities, redirecting WIP, changing lot status or tool status, etc. Also, the Optimizer Module is defined to interact with the RTD system. The Optimizer Module is also capable of implementing a variety of optimization techniques, including both linear and non-linear techniques. Tests can be created and run on the various optimization techniques to verify their stability prior to implementation in the fab. Moreover, the Optimizer Module is defined to record use of the optimization techniques and manual over-ride of the optimization techniques. Additionally, the Optimizer Module is defined to couple with the Analyzer module to provide optimization outputs and controls (near-time or real-time) based on advanced calculations and/or models of the fab.

Additional VAO System Capabilities

Through the development of VAO agents that expose "data" and "control" interfaces to the MES and the other AMHS software components, the VAO Productivity Suite enables the following applications: 1) Virtual Material Handling Products, 2) Station Controller-Based Material Control, 3) Super Cluster Tools, and 4) "Auction" Based Dispatch. Each of the above-mentioned applications is described in more detail below. It should be understood that the above-mentioned applications represent a small number of applications that can be enabled by the VAO system.

Virtual Load Ports

This concept is the creation of "virtual" products or product extensions that utilize the material handling hardware as an extension of the current product. An example of this is the utilization of load ports within a stocker as a tool load port (virtual load port). Although the stocker is a product on its own and a semiconductor tool is a product on its own, exposing control interfaces and data interfaces (via VAO agents) to the stocker robot, load port, and conveyer, allows the tool station controller to control these mechanisms as an extension of the tool. In this way, the number of load ports "seen" by the fab MES can be increased, thereby increasing a tool's buffering capability without the addition of mechanisms to the tool. The load ports are "allocated" from the stocker for use by the tool.

Station Controller-Based Material Control

Another concept that becomes possible by the creation of data and control agents for the material handling system is that tool automation can "extend" into storage locations (such as stockers and even another tool's load ports) such that the material handling system is actually "absorbed" into the tool. From an automation standpoint, the material handling is controlled entirely by these "extended" tool station controllers. These "extended" tool station controllers will handle the logistics of transfer directly to each other rather than be directed by the MCS and MES systems. If each tool's station controller controls material movement up a load port in a stocker, then "tool to tool" transfer amounts to the stocker robot transferring from one stocker load port to another.

Super Cluster Tools

A larger extension of this concept is the creation of super cluster tools whereby semiconductor tools such as a bay of process tools and bay of metrology tools can be merged together into a "super cluster" tool by direct control of a conveyor or OHT system between them, so that as one tool completes its process the lot of wafers can directly move to the next process step without intervention from the MES and the central dispatch software. Rather than utilizing conventional dispatch to determine which tool to go to, an "auction" based dispatcher would be utilized. (See the next concept.) Wide scale implementation of this kind of automation can effectively reduce the tool count in a wafer fab thereby reducing the complexities of MES dispatch in a wafer fab. Throughput between tools that are clustered would be increased as well since material moves could be run in anticipation of material needs, and the overhead of MES to dispatch to MCS to conveyor communications would be eliminated. Stocker storage and under track storage can also be added to the cluster tools capabilities using the same interfaces.

"Auction" Based Dispatch

This concept could be applied across the full fab, in a bay of a fab, or in the "super" cluster concept described above. Dispatch could be handled by an "auction" process whereby the lot of wafers would request "bids" of transfer times in an auction from all available or nearly available "tools" of a given type and the lowest (time) bidder would receive the lot. "Hot" lots would be able to put their lots up for auction first. The bid time would be a computed value including time until the loadport becomes available (in anticipation of a lot completion) and transfer time to the tool (stocker robot transfer time(s)+any applicable OHT or conveyor transport time). Prior to a bid being submitted, the status of tools, load ports, conveyor routes or OHT routes would be checked so that any subsystem failures would be dealt with in real-time. Lots in this method of dispatch will be moved to the closest tool (lowest move time bid) so throughput would be optimized. Decisions on material movement would not be pre-planned or based on out-dated information, but determined by the latest real-time information from the tools and material transfer systems.

VAO GUIs

FIGS. 4.1-4.24 show a number of screenshots of various GUIs generated by the VAO system, in accordance with various embodiments of the present invention. It should be understood that the GUIs shown in FIGS. 4.1-4.24 are exemplary and do not represent a complete GUI generation capability of the VAO system. Each of the GUI examples of FIGS. 4.1-4.24 are briefly described below.

FIGS. 4.1 shows a fab visualizer GUI, in accordance with one embodiment of the present invention. The GUI includes a top menu bar 102 that includes a number of control buttons for controlling operation of the GUI. The drop-down menu 101 enables changing of the table/graph displays to various formats for analysis. The drop-down menu 103 enables selection of a particular fab. The drop-down menu 105 enables selection of a particular floor of the selected fab. The drop-down menu 107 enables selection of a particular phase, i.e., section, of the selected floor of the selected fab. The button 109 enables toggling between a side view and a top view of the selected fab floor. The drop-down menu 111 enables selection of a type of display of the selected fab floor. The button 113 is an on/off toggle for the stockers on the displayed fab floor. The button 115 is an on/off toggle for the lifters on the displayed fab floor. The button 117 is an on/off toggle for the equipment on the displayed fab floor. The button 119 is an on/off toggle for the OHV routes on the displayed fab floor. The button 121 is an on/off toggle for the load ports on the displayed fab floor.

The drop-down menu 123 enables control of actions such as re-routing material or modifying a dispatch plan. The drop-down menu 125 enables selection of various fab data charts for display/analysis. The button 127 enables capturing of a snapshot of the selected fab floor as shown in the GUI. The buttons 129 enables instantaneous translation from one language to another, e.g., from English to Japanese, vice-versa. The field 131 shows a data and time corresponding to the status of the selected fab floor as displayed in the GUI. The interactive map 133 represents the fab by floor (F1, F2, F3, F4, F5) and by phase (P1, P2, P3). Selection of a row or block in the interactive map 133 will cause that section (floor and phase) of the fab to be displayed in the GUI. The GUI further includes a display region 145 in which a live schematic/diagram of the selected portion of the fab is displayed.

The GUI further includes a lower window 134 in which fab data 147 is displayed in either tabular form or graphical form. The button 135 enables access to the MCS data of the fab for generating the tables/graphs in the lower window 134. Selection of the button 137 causes the data to be rendered in tabular form in the lower window 134. Selection of the button 139 causes the data to be rendered in graphical form in the lower window 134. The button 141 generates tables of the fab data in a new window. The button 143 generates graphs of the fab data in a new window. The GUI also provides a zoom function for zooming into and out of the fab as shown in the display region 145.

FIG. 4.2 shows a zoomed in view of the area 149 as selected in the GUI of FIG. 4.1, in accordance with one embodiment of the present invention. FIG. 4.3 shows a window generated in response to selecting button 141 in the GUI of FIG. 4.1, in accordance with one embodiment of the present invention. FIG. 4.4 shows the GUI of FIG. 4.1 following selection of the button 139, in accordance with one embodiment of the present invention. FIG. 4.5 shows the drop-down menus associated with each of the graphs in the lower window 134 of FIG. 4.4, in accordance with one embodiment of the present invention. FIG. 4.6 shows a window generated in response to selecting button 143 in the GUI of FIG. 4.1, in accordance with one embodiment of the present invention.

FIG. 4.7 shows the GUI of FIG. 4.1 following selection of the second floor (F2) of the fab in the interactive map 133, in accordance with one embodiment of the present invention. The schematic/diagram of the second floor (F2) of the fab is shown in the display region 145. FIG. 4.8 shows the fab view of FIG. 4.7 with identification of the routes that are in an abnormal state, in accordance with one embodiment of the present invention. For example, route 201 is identified as being in an abnormal state. FIG. 4.9 shows a snapshot of the GUI of FIG. 4.7 taken by a user-click of the button 127, in accordance with one embodiment of the present invention.

FIG. 4.10 shows the GUI of FIG. 4.1 following selection of the fifth floor (F5) of the fab in the interactive map 133, in accordance with one embodiment of the present invention. The schematic/diagram of the fifth floor (F5) of the fab is shown in the display region 145. FIG. 4.11 shows the GUI of FIG. 4.10 following selection of the Japanese language button 129B, in accordance with one embodiment of the present invention. FIG. 4.12 shows the GUI of FIG. 4.10 following selection of phase 1 (P1) on the fifth floor (F5) of the fab, through selections in the drop-down menus 107 and 105, respectively, in accordance with one embodiment of the present invention. The fab view in the display region 145 shows the cars 207 moving along the routes of the fab. It should be appreciated that a subset of the cars in FIG. 4.12 are identified by the reference number 207 to avoid obscuring the figure.

FIG. 4.13 shows the GUI of FIG. 4.10 with all normal items in the displayed portion of the fab grayed out, thereby enabling easier identification of non-normal items, in accordance with one embodiment of the present invention. It should be understood that the various VAO GUIs are rendered in color with the status and type of various entities in the fab coded by color. Therefore, in a color version of FIG. 4.13, the non-grayed out entities in the fab, i.e., the non-normal entities, would be shown in the color corresponding to their status. For descriptive purposes, the non-normal entities in the grayscale version of FIG. 4.13 are identified by reference numeral 213.

FIG. 4.14 shows the GUI of FIG. 4.10 following selection, i.e., user click-on, of a lifter entity in the displayed fab portion, in accordance with one embodiment of the present invention. Selection of the lifter entity in the displayed fab portion triggers a popup menu 221, which provides selectable options for displaying the alarm history or the job counts for the selected lifter. FIG. 4.15 shows the GUI of FIG. 4.10 following selection, i.e., user click-on, of a tool entity in the displayed fab portion, in accordance with one embodiment of the present invention. Selection of the tool entity in the displayed fab portion triggers a popup menu 227, which provides a selectable option for displaying the alarm history for the selected tool.

FIG. 4.16 shows the GUI of FIG. 4.10 following selection, i.e., user click-on, of a stocker entity in the displayed fab portion, in accordance with one embodiment of the present invention. Selection of the stocker entity in the displayed fab portion triggers a popup menu 231, which provides selectable options for displaying the alarm history, the job counts, or the stocker information for the selected stocker. FIG. 4.17 shows a window generated in response to selecting the stocker information option in the popup menu 231 in the GUI of FIG. 4.16, in accordance with one embodiment of the present invention.

FIG. 4.18 shows the GUI of FIG. 4.10 following selection, i.e., user click-on, of the spreadsheet drop-down menu 125, in accordance with one embodiment of the present invention. Selection of the spreadsheet drop-down menu 125 provides selectable options for displaying various data sets, including transport jobs per bay, queued jobs per bay, job counts per stocker, job counts per lifter, and alarm history. FIG. 4.19 shows a window generated in response to selecting the transport jobs per bay option in the spreadsheet drop-down menu 125, in accordance with one embodiment of the present invention. FIG. 4.20 shows a window generated in response to selecting the queued jobs per bay option in the spreadsheet drop-down menu 125, in accordance with one embodiment of the present invention.

FIG. 4.21 shows a window generated in response to selecting the job counts per stocker option in the spreadsheet drop-down menu 125, in accordance with one embodiment of the present invention. FIG. 4.22 shows a window generated in response to selecting the job counts per lifter option in the spreadsheet drop-down menu 125, in accordance with one embodiment of the present invention. FIG. 4.23 shows a window generated in response to selecting the alarm history option in the spreadsheet drop-down menu 125, in accordance with one embodiment of the present invention. FIG. 4.24 shows the GUI of FIG. 4.1 following a toggling of the button 109 to display a side view of the fab, in accordance with one embodiment of the present invention.

Exemplary Embodiments

In one embodiment, a semiconductor fabrication facility (fab) visualization system is provided. The fab visualization system includes a fab configuration module defined to virtually model physical systems and attributes of the fab that is to be monitored. The fab configuration module provides for construction of a facility logic model that defines hierarchies and relationships between components within the fab. To this end, the fab configuration module generates a GUI through which tools and icons are provided for virtual modeling of physical systems and attributes of the fab, and of hierarchies and relationships between components within the fab.

The fab visualization system also includes a data acquisition module defined to interface with the physical systems of the fab and to gather operational data from the physical systems. The data acquisition module is defined to provide a data agent and a control agent for each system within the fab. The data agent and control agent for a given system is customized to interface with the given system without requiring modification of the given system and without interfering with normal operation of the given system. The data agent is defined to acquire data from the given system. The control agent is defined to direct communication of the acquired data to the visualizer module.

In one embodiment, the data acquisition module provides a respective data agent and controller agent for each of a material control system, a manufacturing execution system, and an automated material handling system. In an extension of this embodiment, the data acquisition module further provides a respective data agent and controller agent for each of a dispatch system, an engineering and manufacturing database, a stocker system, an overhead hoist vehicle controller system, a conveyer system, and a processing tool system.

The fab visualization system also includes a visualizer module defined to collect and aggregate the operational data gathered from the physical systems. The visualizer module is further defined to process the operational data into a format suitable for visual rendering. The processed operational data is displayed within a visual context of the fab within a graphical user interface that is controlled by the visualizer module. In one embodiment, the data acquisition module and visualizer module are defined to gather and process operational data to enable real-time display of fabrication facility operation within the graphical user interface. The fab visualization system can also include a database defined to store data associated with operations of the fabrication facility configuration module, the data acquisition module, the visualizer module, and the graphical user interface.

In another embodiment, a semiconductor fab productivity system is disclosed. The fab productivity system includes a visualizer module, an analyzer module, and an optimizer module. The visualizer module is defined to collect, filter, and present fabrication facility data through a graphical user interface. More specifically, the visualizer module is defined to integrate and present data from disparate independent sources in the fabrication facility. In one embodiment, the visualizer module is defined to collect and code rules of the fabrication facility, wherein the rules include both business rules and operational rules. The analyzer module is defined to analyze data collected by the visualizer module to resolve queries regarding fabrication facility performance. The optimizer module is defined to control systems within the fabrication facility in response to data collected by the visualizer module, data generated by the analyzer module, or a combination thereof. The optimizer module can be operated in either a suggestion mode or in an action mode.

The analyzer module is defined to identify data patterns relevant to fabrication facility problems, deficiencies, or inefficiencies, and is further defined to provide tools for creating and exploring hypotheses about fabrication facility performance. In one embodiment, the analyzer module is defined to perform comparative analyses between different fabrication facility operational periods, basic value analyses corresponding to particular operational instances, exploratory analyses, fabrication facility simulations, and fabrication facility rule change analyses. The analyzer module can also include a traffic congestion monitoring module defined to record, analyze, and report on vehicle density within a region of the fabrication facility. The traffic congestion module is further defined to identify precursors to congestion events and issue corresponding notifications to enable mitigation of pending congestion events.

The analyzer module can further includes a number of additional analysis modules. For example, the analyzer module can include a traffic state analysis module defined to calculate quality of service metrics that characterize traffic congestion within the fab. The analyzer module can also include an E84 event monitoring agent defined to acquire E84 event data and perform trending analyses on the acquired E84 event data. The analyzer module can further include a raw process throughput analysis module define to perform internal tool throughput analysis and reporting. Additionally, the analyzer module can include operational bottleneck and work-in-progress tracking agents defined to calculate queue sizes by operation, tool group, and tool, and further defined to analyze processing load bursts and corresponding effects on tool queue reserve.

In another embodiment, a method is disclosed for monitoring semiconductor fab operations. In this method, operational data is acquired from different systems within a fab. The operational data is acquired without interfering with normal operation of the different systems within the fabrication facility. The acquired operational data is then aggregated. Also, the aggregated operational data is rendered in a GUI within a visual context of the fabrication facility. The visual context of the fab shows icons for different systems from which operational data is acquired. The aggregated operational data for the different systems is simultaneously displayed in relation to the icons for the different systems.

In one embodiment, operational data is acquired for an automated material handling system to include real-time position data for various conveyances within the fabrication facility. The real-time position data for various conveyances within the fabrication facility is used to provide a real-time update of a visual rendering of the various conveyances on a route map within the graphical user interface.

It should be understood that the VAO Productivity Suite disclosed herein can be stored in a tangible form, such as in a digital format on a computer readable medium. Also, the invention described herein can be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the VAO system are useful machine operations. The VAO system also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the VAO system can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor fabrication facility productivity system, comprising:
   one or more processors; and one or more computer-readable media configured to store instructions that are executable by the one or more processors to perform operations comprising:
- collecting fabrication facility data for a fabrication facility;
- identifying, in the fabrication facility data, data patterns;
- identifying, based on the data patterns, a decrease in performance of an operation of the fabrication facility at a first time relative to performance of the operation at a second time;
- implementing, in response to identification of the decrease in the performance, experiments, wherein an experiment comprises one or more modifications to conditions of the fabrication facility at the first time;
- identifying, based on comparing results of the experiments, an experiment with a result specifying an increase in the performance of the operation relative to other of the results for other of the experiments; and
- executing, at a third time when conditions of the fabrication facility correspond to at least one of the conditions at the first time, a command to implement at least one of one or more modifications of the experiment identified by the one or more processors.

2. The semiconductor fabrication facility productivity system of claim 1, wherein collecting comprises:
- collecting the fabrication facility data from disparate sources in the fabrication facility;
- wherein the operations further comprise:
  - integrating the fabrication facility data collected from the disparate sources in the fabrication facility.

3. The semiconductor fabrication facility productivity system of claim 1, wherein the operations further comprise:
- collecting rules of the fabrication facility, wherein the rules comprise one or more of business rules and operational rules.

4. The semiconductor fabrication facility productivity system of claim 1, wherein the decrease in the performance is further indicative of one or more fabrication facility problems.

5. The semiconductor fabrication facility productivity system of claim 1, wherein the operations further comprise:
- performing comparative analyses among a plurality of experiments comprising the modifications;
- wherein identifying the at least one of the modifications comprises:
  - identifying based on performing the comparative analyses.

6. The semiconductor fabrication facility productivity system of claim 1, wherein the operations further comprise:
- monitoring the traffic congestion in the fabrication facility, wherein the traffic congestion is indicative of vehicle density within a region of the fabrication facility.

7. The semiconductor fabrication facility productivity system of claim 6, wherein the operations further comprise:
- calculating quality of service metrics that characterize the traffic congestion within the fabrication facility.

8. The semiconductor fabrication facility productivity system of claim 1, wherein the operations further comprise:
- performing trending analyses on the fabrication facility data;
- wherein identifying the data patterns comprises:
  - identifying, at least partly based on the trending analyses, the data patterns.

9. One or more computer-readable media configured to store instructions that are executable by one or more processors to perform operations comprising:
- collecting fabrication facility data for a fabrication facility;
- identifying, in the fabrication facility data, data patterns;
- identifying, based on the data patterns, a decrease in performance of an operation of the fabrication facility at a first time relative to performance of the operation at a second time;
- implementing, in response to identification of the decrease in the performance, experiments, wherein an experiment comprises one or more modifications to conditions of the fabrication facility at the first time;
- identifying, based on comparing results of the experiments, an experiment with a result specifying an increase in the performance of the operation relative to other of the results for other of the experiments; and
- executing, at a third time when conditions of the fabrication facility correspond to at least one of the conditions at the first time, a command to implement at least one of one or more modifications of the experiment identified by the one or more processors.

10. The one or more computer-readable media of claim 9, wherein collecting comprises:
- collecting the fabrication facility data from disparate sources in the fabrication facility;
- wherein the operations further comprise:
  - integrating the fabrication facility data collected from the disparate sources in the fabrication facility.

11. The one or more computer-readable media of claim 9, wherein the operations further comprise:
- collecting rules of the fabrication facility, wherein the rules comprise one or more of business rules and operational rules.

12. The one or more computer-readable media of claim 9, wherein the decrease in the performance is further indicative of one or more fabrication facility problems.

13. The one or more computer-readable media of claim 9, wherein the operations further comprise:
- performing comparative analyses among a plurality of experiments comprising the modifications;
- wherein identifying the at least one of the modifications comprises:
  - identifying based on performing the comparative analyses.

14. The one or more computer-readable media of claim 9, wherein the operations further comprise:
- monitoring the traffic congestion in the fabrication facility, wherein the traffic congestion is indicative of vehicle density within a region of the fabrication facility.

15. The one or more computer-readable media of claim 14, wherein the operations further comprise:
- calculating quality of service metrics that characterize the traffic congestion within the fabrication facility.

16. The one or more computer-readable media of claim 9, wherein the operations further comprise:
- performing trending analyses on the fabrication facility data;
- wherein identifying the data patterns comprises:
  - identifying, at least partly based on the trending analyses, the data patterns.

17. A method implemented by one or more processors, comprising:
- collecting fabrication facility data for a fabrication facility;
- identifying, in the fabrication facility data, data patterns;
- identifying, based on the data patterns, a decrease in performance of an operation of the fabrication facility at a first time relative to performance of the operation at a second time;
- implementing, in response to identification of the decrease in the performance, experiments, wherein an experiment comprises one or more modifications to conditions of the fabrication facility at the first time;

identifying, based on comparing results of the experiments, an experiment with a result specifying an increase in the performance of the operation relative to other of the results for other of the experiments; and executing, at a third time when conditions of the fabrication facility correspond to at least one of the conditions at the first time, a command to implement at least one of one or more modifications of the experiment identified by the one or more processors.

18. The method of claim 17, wherein collecting comprises:

collecting the fabrication facility data from disparate sources in the fabrication facility;

wherein the method further comprises:

integrating the fabrication facility data collected from the disparate sources in the fabrication facility.

19. The method of claim 17, further comprising:

collecting rules of the fabrication facility, wherein the rules comprise one or more of business rules and operational rules.

20. The method of claim 17, wherein the decrease in the performance is further indicative of one or more fabrication facility problems.

21. The method of claim 17, further comprising:

performing comparative analyses among a plurality of experiments comprising the modifications;

wherein identifying the at least one of the modifications comprises:

identifying based on performing the comparative analyses.

22. The method of claim 17, further comprising:

monitoring the traffic congestion in the fabrication facility, wherein the traffic congestion is indicative of vehicle density within a region of the fabrication facility.

23. The method of claim 22, further comprising:

calculating quality of service metrics that characterize the traffic congestion within the fabrication facility.

24. The method of claim 17, further comprising:

performing trending analyses on the fabrication facility data;

wherein identifying the data patterns comprises:

identifying, at least partly based on the trending analyses, the data patterns.

* * * * *